United States Patent
Feng et al.

(10) Patent No.: US 12,334,022 B2
(45) Date of Patent: *Jun. 17, 2025

(54) SHIFT REGISTER UNIT, GATE DRIVING CIRCUIT, DISPLAY DEVICE AND DRIVING METHOD

(71) Applicants: HEFEI BOE JOINT TECHNOLOGY CO., LTD., Hefei (CN); BOE TECHNOLOGY GROUP CO., LTD., Beijing (CN)

(72) Inventors: Xuehuan Feng, Beijing (CN); Yongqian Li, Beijing (CN); Hao Liu, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/618,413

(22) Filed: Mar. 27, 2024

(65) Prior Publication Data

US 2024/0242680 A1    Jul. 18, 2024

Related U.S. Application Data

(63) Continuation of application No. 18/108,730, filed on Feb. 13, 2023, now Pat. No. 11,984,085, which is a
(Continued)

(30) Foreign Application Priority Data

Jan. 18, 2019   (CN) .......................... 201910048927.5

(51) Int. Cl.
*G09G 3/3266*   (2016.01)
*G09G 3/3225*   (2016.01)
*G11C 19/28*    (2006.01)

(52) U.S. Cl.
CPC .......... *G09G 3/3266* (2013.01); *G09G 3/3225* (2013.01); *G11C 19/28* (2013.01); *G09G 2310/0286* (2013.01)

(58) Field of Classification Search
CPC .... G11C 19/28; G09G 3/3266; G09G 3/3225; G09G 2310/0286
See application file for complete search history.

(56) References Cited

U.S. PATENT DOCUMENTS

| 9,443,458 | B2 | 9/2016 | Shang |
| 9,483,933 | B1 | 11/2016 | Dai et al. |

(Continued)

FOREIGN PATENT DOCUMENTS

| CN | 103927965 A | 7/2014 |
| CN | 104505049 A | 4/2015 |

(Continued)

OTHER PUBLICATIONS

Non-final Office Action from U.S. Appl. No. 16/766,470 mailed Apr. 21, 2021.
(Continued)

*Primary Examiner* — Xuemei Zheng
(74) *Attorney, Agent, or Firm* — Dilworth & Barrese, LLP.; Michael J. Musella, Esq.

(57) ABSTRACT

A shift register unit, a gate driving circuit, a display device, and a driving method are disclosed. The shift register unit includes a first sub-circuit, a second sub-circuit, a leakage prevention circuit and a blanking input sub-circuit, wherein the first sub-circuit includes a first input circuit and a first output circuit; the second sub-circuit includes a second input circuit and a second output circuit; the leakage prevention circuit is configured to control a level of a leakage prevention node under control of the level of the first node, so as to turn off a circuit connected between the first node and the
(Continued)

leakage prevention node; and the blanking input sub-circuit is connected to the first node and the second node, and is configured to receive a selection control signal and a first clock signal, and control the level of the first node and the level of the second node.

20 Claims, 15 Drawing Sheets

Related U.S. Application Data continuation of application No. 17/490,054, filed on Sep. 30, 2021, now Pat. No. 11,615,743, which is a continuation of application No. 16/766,470, filed as application No. PCT/CN2019/128655 on Dec. 26, 2019, now Pat. No. 11,164,516.

(56) References Cited

U.S. PATENT DOCUMENTS

| | | | |
|---|---|---|---|
| 10,068,544 B2 | 9/2018 | Li et al. | |
| 11,238,085 B2* | 2/2022 | Yen | G09B 7/04 |
| 11,238,805 B2 | 2/2022 | Feng | |
| 11,984,085 B2* | 5/2024 | Feng | G09G 3/3225 |
| 2006/0220587 A1 | 10/2006 | Tobita et al. | |
| 2010/0177082 A1 | 7/2010 | Joo et al. | |
| 2015/0036784 A1 | 2/2015 | Quing et al. | |
| 2015/0317954 A1 | 11/2015 | Jang | |
| 2016/0253976 A1 | 9/2016 | Jang et al. | |
| 2017/0032733 A1 | 2/2017 | Jang | |
| 2017/0287427 A1 | 10/2017 | Kim et al. | |
| 2017/0344179 A1 | 11/2017 | Kim et al. | |
| 2018/0337682 A1 | 11/2018 | Takasugi | |
| 2019/0130848 A1 | 5/2019 | Kim et al. | |
| 2019/0164478 A1 | 5/2019 | Kim et al. | |
| 2019/0164498 A1 | 5/2019 | Jang | |
| 2020/0027516 A1 | 1/2020 | Feng | |
| 2020/0051507 A1 | 2/2020 | Feng et al. | |
| 2020/0135287 A1 | 4/2020 | Han | |
| 2020/0168162 A1 | 5/2020 | Feng | |
| 2021/0158742 A1* | 5/2021 | Feng | G11C 19/28 |
| 2021/0201774 A1* | 7/2021 | Feng | G11C 19/28 |
| 2021/0201804 A1* | 7/2021 | Feng | G09G 3/3266 |
| 2021/0201805 A1* | 7/2021 | Feng | G09G 3/3258 |
| 2021/0201807 A1* | 7/2021 | Feng | G09G 3/3266 |
| 2021/0327363 A1* | 10/2021 | Feng | G11C 19/28 |
| 2021/0335177 A1* | 10/2021 | Feng | G11C 19/28 |
| 2021/0335203 A1* | 10/2021 | Feng | G09G 3/2092 |
| 2021/0335266 A1* | 10/2021 | Feng | G09G 3/20 |
| 2021/0358366 A1* | 11/2021 | Feng | G09G 3/20 |
| 2021/0375211 A1* | 12/2021 | Feng | G09G 3/20 |

FOREIGN PATENT DOCUMENTS

| | | |
|---|---|---|
| CN | 106098002 A | 11/2016 |
| CN | 106128409 A | 11/2016 |
| CN | 107909959 A | 4/2018 |
| CN | 108597438 A | 9/2018 |
| CN | 108648686 A | 10/2018 |
| CN | 108711401 A | 10/2018 |
| CN | 108806611 A | 11/2018 |
| CN | 108877682 A | 11/2018 |
| CN | 109166527 A | 1/2019 |
| CN | 109166529 A | 1/2019 |
| CN | 109166600 A | 1/2019 |
| CN | 109935187 A | 6/2019 |
| CN | 109935204 A | 6/2019 |
| KR | 1020100083370 A | 7/2010 |
| KR | 20170078978 A | 7/2017 |
| WO | 2018230456 A1 | 12/2018 |

OTHER PUBLICATIONS

First Chinese Office Action from Chinese Patent Application No. 201910048927.5 dated Jun. 18, 2021.
Non-final Office Action from U.S. Appl. No. 17/490,054 mailed Jul. 28, 2022.
International Search Report and Written Opinion Mailed Dec. 26, 2019 from State Intellectual Property Office of the P.R. China.
Non-final Office Action from U.S. Appl. No. 18/108,730 mailed Sep. 7, 2023.
Notice of Allowance from U.S. Appl. No. 18/108,730 mailed Apr. 3, 2024.
Non-final Office Action from U.S. Appl. No. 16/766,450 mailed Apr. 28, 2021.
Chinese Office Action from Chinese Patent Application No. 201910049743.0 dated Apr. 29, 2020.

* cited by examiner

SHIFT REGISTER UNIT, GATE DRIVING CIRCUIT, DISPLAY DEVICE AND DRIVING METHOD

CROSS-REFERENCE TO RELATED APPLICATION

This application is a continuation of U.S. patent application Ser. No. 18/108,730 filed on Feb. 13, 2023, which is a continuation of U.S. patent application Ser. No. 17/490,054 filed on Sep. 30, 2021, which is a continuation of U.S. patent application Ser. No. 16/766,470 filed on May 22, 2020, which is a U.S. national stage application of international application PCT/CN2019/128655 filed on Dec. 26, 2019, which claims the priority of Chinese patent application No. 201910048927.5 filed on Jan. 18, 2019. For all purposes, the entire disclosures of the aforementioned applications are incorporated by reference as part of the disclosure of this application.

TECHNICAL FIELD

Embodiments of the present disclosure relate to a shift register unit, a gate driving circuit, a display device, and a driving method.

BACKGROUND

In the display field, especially in an OLED (organic light-emitting diode) display panel, a gate driving circuit is generally integrated in a GATE IC. The area of a chip in IC design is a main factor affecting the cost of the chip, and technology developers need to focus on how to effectively reduce the area of the chip.

SUMMARY

At least an embodiment of the present disclosure provides a shift register unit, including a first sub-circuit, a second sub-circuit, and a leakage prevention circuit. The first sub-circuit includes a first input circuit and a first output circuit, the first input circuit is configured to control a level of a first node in response to a first input signal, and the first output circuit is configured to output a shift signal and a first output signal under control of the level of the first node; the second sub-circuit includes a second input circuit and a second output circuit, the second input circuit is configured to control a level of a second node in response to the first input signal while the first input circuit controls the level of the first node, and the second output circuit is configured to output a second output signal under control of the level of the second node; and the leakage prevention circuit is connected to the first node, and is configured to control a level of a leakage prevention node under control of the level of the first node, so as to turn off a circuit connected between the first node and the leakage prevention node and turn off a circuit connected between the second node and the leakage prevention node.

For example, in the shift register unit provided by some embodiments of the present disclosure, the first input circuit is connected to the first node and the leakage prevention node, and is further configured to control the level of the leakage prevention node in respond to the first input signal; and the second input circuit is connected to the second node and the leakage prevention node, and is configured to transmit the level of the leakage prevention node to the second node in response to the first input signal.

For example, in the shift register unit provided by some embodiments of the present disclosure, the leakage prevention circuit includes a first leakage prevention transistor, the first input circuit includes a first input transistor and a second input transistor, and the second input circuit includes a third input transistor; a gate electrode of the first leakage prevention transistor is connected to the first node, a first electrode of the first leakage prevention transistor is configured to receive a first voltage, and a second electrode of the first leakage prevention transistor is connected to the leakage prevention node; a gate electrode of the first input transistor and a first electrode of the first input transistor are configured to receive the first input signal, and a second electrode of the first input transistor is connected to the leakage prevention node; a gate electrode of the second input transistor is configured to receive the first input signal, a first electrode of the second input transistor is connected to the leakage prevention node, and a second electrode of the second input transistor is connected to the first node; and a gate electrode of the third input transistor is configured to receive the first input signal, a first electrode of the third input transistor is connected to the leakage prevention node, and a second electrode of the third input transistor is connected to the second node.

For example, the shift register unit provided by some embodiments of the present disclosure further includes a blanking input sub-circuit. The blanking input sub-circuit is connected to the first node and the second node, and is configured to receive a selection control signal and control the level of the first node and the level of the second node.

For example, in the shift register unit provided by some embodiments of the present disclosure, the blanking input sub-circuit includes a selection control circuit, a third input circuit, a first transmission circuit, and a second transmission circuit; the selection control circuit is configured to control a level of a third node using a second input signal in response to the selection control signal, and maintain the level of the third node; the third input circuit is configured to transmit a first clock signal to a fourth node under control of the level of the third node; the first transmission circuit is electrically connected to the first node, the fourth node, and the leakage prevention node, and is configured to control the level of the first node and the level of the leakage prevention node in response to the first clock signal; and the second transmission circuit is connected to the second node and the leakage prevention node, and is configured to transmit the level of the leakage prevention node to the second node in response to the first clock signal.

For example, in the shift register unit provided by some embodiments of the present disclosure, the first transmission circuit includes a first transmission transistor and a second transmission transistor, and the second transmission circuit includes a third transmission transistor; a gate electrode of the first transmission transistor is configured to receive the first clock signal, a first electrode of the first transmission transistor is connected to the fourth node, and a second electrode of the first transmission transistor is connected to the leakage prevention node; a gate electrode of the second transmission transistor is configured to receive the first clock signal, a first electrode of the second transmission transistor is connected to the leakage prevention node, and a second electrode of the second transmission transistor is connected to the first node; and a gate electrode of the third transmission transistor is configured to receive the first clock signal, a first electrode of the third transmission transistor is connected to the leakage prevention node, and a second electrode of the third transmission transistor is connected to the second node.

For example, in the shift register unit provided by some embodiments of the present disclosure, the first sub-circuit further includes a first control circuit, a first reset circuit, a second reset circuit, a shift signal output terminal, and a first output signal terminal; the second sub-circuit further includes a second control circuit, a third reset circuit, a fourth reset circuit, and a second output signal terminal; the shift signal output terminal is configured to output the shift signal, the first output signal terminal is configured to output the first output signal, and the second output signal terminal is configured to output the second output signal; the first control circuit is configured to control a level of a fifth node under control of both the level of the first node and a second voltage; the first reset circuit is connected to the first node and the leakage prevention node, and is configured to reset the first node and the leakage prevention node under control of the level of the fifth node; the second reset circuit is configured to reset the shift signal output terminal and the first output signal terminal under control of the level of the fifth node; the second control circuit is configured to control a level of a sixth node under control of both the level of the second node and the second voltage; the third reset circuit is connected to the second node and the leakage prevention node, and is configured to transmit the level of the leakage prevention node to the second node under control of the level of the sixth node; and the fourth reset circuit is configured to reset the second output signal terminal under control of the level of the sixth node.

For example, in the shift register unit provided by some embodiments of the present disclosure, the first reset circuit includes a first reset transistor and a second reset transistor, and the third reset circuit includes a third reset transistor; a gate electrode of the first reset transistor is connected to the fifth node, a first electrode of the first reset transistor is connected to the first node, and a second electrode of the first reset transistor is connected to the leakage prevention node; a gate electrode of the second reset transistor is connected to the fifth node, a first electrode of the second reset transistor is connected to the leakage prevention node, and a second electrode of the second reset transistor is configured to receive a third voltage; and a gate electrode of the third reset transistor is connected to the sixth node, a first electrode of the third reset transistor is connected to the second node, and a second electrode of the third reset transistor is connected to the leakage prevention node.

For example, in the shift register unit provided by some embodiments of the present disclosure, the first sub-circuit further includes a third control circuit, a fourth control circuit, and a common control circuit, and the second sub-circuit further includes a fifth control circuit and a sixth control circuit; the third control circuit is connected to the fifth node and a common control node, and is configured to, in response to the first clock signal, enable the fifth node to be electrically connected to the common control node; the common control circuit is electrically connected to the common control node and the third node, and is configured to control a level of the common control node under control of the level of the third node; the fourth control circuit is configured to control the level of the fifth node in response to the first input signal; the fifth control circuit is connected to the sixth node and the common control node, and is configured to, in response to the first clock signal, enable the sixth node to be electrically connected to the common control node; and the sixth control circuit is configured to control the level of the sixth node in response to the first input signal.

For example, in the shift register unit provided by some embodiments of the present disclosure, the third control circuit includes a first control transistor, the common control circuit includes a second control transistor, and the fifth control circuit includes a third control transistor; a gate electrode of the first control transistor is configured to receive the first clock signal, a first electrode of the first control transistor is connected to the fifth node, and a second electrode of the first control transistor is connected to the common control node; a gate electrode of the second control transistor is connected to the third node, a first electrode of the second control transistor is connected to the common control node, and a second electrode of the second control transistor is configured to receive a third voltage; and a gate electrode of the third control transistor is configured to receive the first clock signal, a first electrode of the third control transistor is connected to the sixth node, and a second electrode of the third control transistor is connected to the common control node.

For example, in the shift register unit provided by some embodiments of the present disclosure, the first sub-circuit further includes a fifth reset circuit, and the second sub-circuit further includes a sixth reset circuit; the fifth reset circuit is connected to the first node and the leakage prevention node, and is configured to reset the first node and the leakage prevention node in response to a display reset signal; and the sixth reset circuit is connected to the second node and the leakage prevention node, and is configured to transmit the level of the leakage prevention node to the second node in response to the display reset signal.

For example, in the shift register unit provided by some embodiments of the present disclosure, the fifth reset circuit includes a fourth reset transistor and a fifth reset transistor, and the sixth reset circuit includes a sixth reset transistor; a gate electrode of the fourth reset transistor is configured to receive the display reset signal, a first electrode of the fourth reset transistor is connected to the first node, and a second electrode of the fourth reset transistor is connected to the leakage prevention node; a gate electrode of the fifth reset transistor is configured to receive the display reset signal, a first electrode of the fifth reset transistor is connected to the leakage prevention node, and a second electrode of the fifth reset transistor is configured to receive a third voltage; a gate electrode of the sixth reset transistor is configured to receive the display reset signal, a first electrode of the sixth reset transistor is connected to the second node, and a second electrode of the sixth reset transistor is connected to the leakage prevention node.

For example, in the shift register unit provided by some embodiments of the present disclosure, the first sub-circuit further includes a seventh reset circuit, and the second sub-circuit further includes an eighth reset circuit; the seventh reset circuit is connected to the first node and the leakage prevention node, and is configured to reset the first node and the leakage prevention node in response to a total reset signal; and the eighth reset circuit is connected to the second node and the leakage prevention node, and is configured to transmit the level of the leakage prevention node to the second node in response to the total reset signal.

For example, in the shift register unit provided by some embodiments of the present disclosure, the seventh reset circuit includes a seventh reset transistor and an eighth reset transistor, and the eighth reset circuit includes a ninth reset transistor; a gate electrode of the seventh reset transistor is configured to receive the total reset signal, a first electrode of the seventh reset transistor is connected to the first node, and a second electrode of the seventh reset transistor is connected to the leakage prevention node; a gate electrode of the eighth reset transistor is configured to receive the total reset signal, a first electrode of the eighth reset transistor is connected to the leakage prevention node, and a second electrode of the eighth reset transistor is configured to receive a third voltage; and a gate electrode of the ninth reset transistor is configured to receive the total reset signal, a first electrode of the ninth reset transistor is connected to the second node, and a second electrode of the ninth reset transistor is connected to the leakage prevention node.

For example, the shift register unit provided by some embodiments of the present disclosure further includes a third sub-circuit and a fourth sub-circuit, and the first sub-circuit, the second sub-circuit, the third sub-circuit, and the fourth sub-circuit are all connected to the leakage prevention node.

For example, in the shift register unit provided by some embodiments of the present disclosure, the first sub-circuit and the second sub-circuit share the blanking input sub-circuit.

For example, in the shift register unit provided by some embodiments of the present disclosure, the first sub-circuit, the second sub-circuit, the third sub-circuit, and the fourth sub-circuit share the blanking input sub-circuit.

At least an embodiment of the present disclosure provides a gate driving circuit, including a plurality of cascaded shift register units each of which is the shift register unit according to any one of the embodiments of the present disclosure.

At least an embodiment of the present disclosure provides a display device, including the gate driving circuit according to any one of the embodiments of the present disclosure.

At least an embodiment of the present disclosure provides a driving method for the shift register unit any one of the embodiments of the present disclosure, including causing the leakage prevention circuit to control the level of the leakage prevention node under control of the level of the first node, so as to turn off the circuit connected between the first node and the leakage prevention node and turn off the circuit connected between the second node and the leakage prevention node.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

Figure 1:
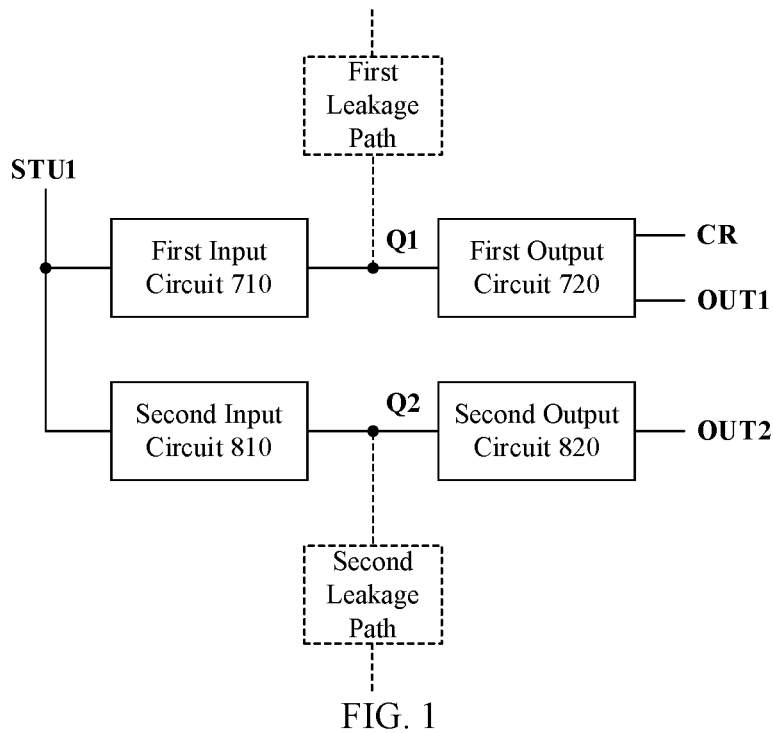
FIG. 1 is a schematic diagram of a shift register unit.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", "coupled", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the embodiments of the present disclosure, for example, in the case where each circuit is implemented by the N-type transistors, the term "pull-up" means charging a node or an electrode of a transistor to allow the absolute value of the level of the node or the electrode to be increased, so as to implement a corresponding operation (e.g., turn-on) of the transistor; and the term "pull-down" means discharging a node or an electrode of a transistor to allow the absolute value of the level of the node or the electrode to be reduced, so as to implement a corresponding operation (e.g., turn-off) of the transistor.

For another example, in the case where each circuit is implemented by the P-type transistors, the term "pull-up" means discharging a node or an electrode of a transistor to allow the absolute value of the level of the node or the electrode to be reduced, so as to implement a corresponding operation (e.g., turn-on) of the transistor; and the term "pull-down" means charging a node or an electrode of a transistor to allow the absolute value of the level of the node or the electrode to be increased, so as to implement a corresponding operation (e.g., turn-off) of the transistor.

Moreover, the specific meanings of the terms "pull-up" and "pull-down" may further be accordingly adjusted based on the specific type of the transistor, as long as the transistor can be controlled to implement the corresponding switch function.

Currently, a gate driving circuit for OLED usually includes three sub-circuits, that is, a detecting circuit, a display circuit, and a connecting circuit (or a gate circuit) for outputting a composite pulse of the detecting circuit and the display circuit. The circuit structure of the gate driving circuit is extremely complicated and cannot satisfy the requirements for a high resolution and a narrow bezel of a display panel.

FIG. 1 illustrates a shift register unit, for example, the shift register unit includes a first input circuit 710, a first output circuit 720, a second input circuit 810, and a second output circuit 820. The first input circuit 710 is configured to control the level of a first node Q1 in response to a first input signal STU1, the first output circuit 720 is configured to output a shift signal CR and a first output signal OUT1 under the control of the level of the first node Q1, the second input circuit 810 is configured to control the level of a second node Q2 in response to the first input signal STU1, and the second output circuit 820 is configured to output a second output signal OUT2 under control the level of the second node Q2. For example, when the first input signal STU1 is at a high level, the first node Q1 and the second node Q2 may be simultaneously charged.

For example, a plurality of the shift register units as illustrated in FIG. 1 may be cascaded to form a gate driving circuit, and the gate driving circuit may be used to drive a display device to perform a display operation. For example, the shift signal CR output by the first output circuit 720 in the shift register unit of a certain stage may be provided to the shift register unit of other stage as the first input signal STU1, thereby completing the progressive shift of the display scanning. For example, the first output signal OUT1 and the second output signal OUT2 output by the shift register unit of a certain stage may respectively drive two adjacent rows of pixel units in the display panel to perform display scanning.

For example, in the shift register unit illustrated in FIG. 1, in order to enable the shift register unit work better, other circuits need to be provided to better control the level of the first node Q1, for example, one or more reset circuits connected to the first node Q1 are provided. For example, after the shift register unit finishes outputting the first output signal OUT1, a reset circuit is used to reset the level of the first node Q1. For example, this reset operation changes the level of the first node Q1 from a high level to a low level. For example, when the level of the first node Q1 is a high level, if the above reset circuit cannot be completely turned off, the first node Q1 may leak through one or more of these reset circuits, that is, the first node Q1 may leak through the first leakage path indicated by the dashed line in FIG. 1, which may cause the level of the first node Q1 cannot be maintained at a higher level when the first output circuit 720 performs output, which may result in deviation of the first output signal OUT1, thus causing the display panel adopting the gate driving circuit formed by the shift register unit to display poorly.

Similarly, in the shift register unit illustrated in FIG. 1, in order to enable the shift register unit work better, other circuits need to be provided to better control the level of the second node Q2, for example, one or more reset circuits connected to the second node Q2 are provided. For example, after the shift register unit finishes outputting the second output signal OUT2, a reset circuit is used to reset the level of the second node Q2. For example, this reset operation changes the level of the second node Q2 from a high level to a low level. For example, the reset operation for the first node Q1 and the second node Q2 may be performed simultaneously, so that the first node Q1 and the second node Q2 are simultaneously pulled down to a low level. For example, when the level of the second node Q2 is a high level, if the above reset circuit cannot be completely turned off, the second node Q2 may leak through one or more of these reset circuits, that is, the second node Q2 may leak through the second leakage path indicated by the dashed line in FIG. 1, which may cause the level of the second node Q2 cannot be maintained at a higher level when the second output circuit 820 performs output, which may result in deviation of the second output signal OUT2, thus causing the display panel adopting the gate driving circuit formed by the shift register unit to display poorly.

It should be noted that, in some embodiments of the present disclosure, a circuit path, which is connected to the first node Q1, that may cause leakage of the first node Q1 is called a first leakage path, and the first leakage path may include one or more circuits (or sub-circuits), for example, includes a reset circuit that performs a reset operation on the first node Q1; a circuit path, which is connected to the second node Q2, that may cause leakage of the second node Q2 is called a second leakage path, and the second leakage path may include one or more circuits (or sub-circuits), for example, includes a reset circuit that performs a reset operation on the second node Q2. The following embodiments are the same and will not be described in detail.

At least one embodiment of the present disclosure provides a shift register unit, and the shift register unit includes a first sub-circuit, a second sub-circuit, and a leakage prevention circuit. The first sub-circuit includes a first input circuit and a first output circuit, the first input circuit is configured to control a level of a first node in response to a first input signal, and the first output circuit is configured to output a shift signal and a first output signal under control of the level of the first node; the second sub-circuit includes a second input circuit and the second output circuit, the second input circuit is configured to control a level of a second node in response to the first input signal while the first input circuit controls the level of the first node, and the second output circuit is configured to output a second output signal under control of the level of the second node; and the leakage prevention circuit is connected to the first node, and is configured to control a level of the leakage prevention node under control of the level of the first node, so as to turn off a circuit connected between the first node and the leakage prevention node and turn off a circuit connected between the second node and the leakage prevention node.

Some embodiments of the present disclosure further provide a gate driving circuit, a display device, and a driving method corresponding to the above shift register unit.

The shift register unit, the gate driving circuit, the display device and the driving method provided by some embodiments of the present disclosure can avoid the leakage of the first node and the second node, and avoid the problem of poor display of the display device adopting the gate driving circuit formed by the shift register unit. In addition, some embodiments of the present disclosure can also simplify the circuit structure, so that the bezel size of the display device adopting the gate driving circuit may be reduced, and the PPI of the display device may be improved.

In the following, the embodiments of the present disclosure and the examples thereof are described in detail with reference to the accompanying drawings.

Figure 2:
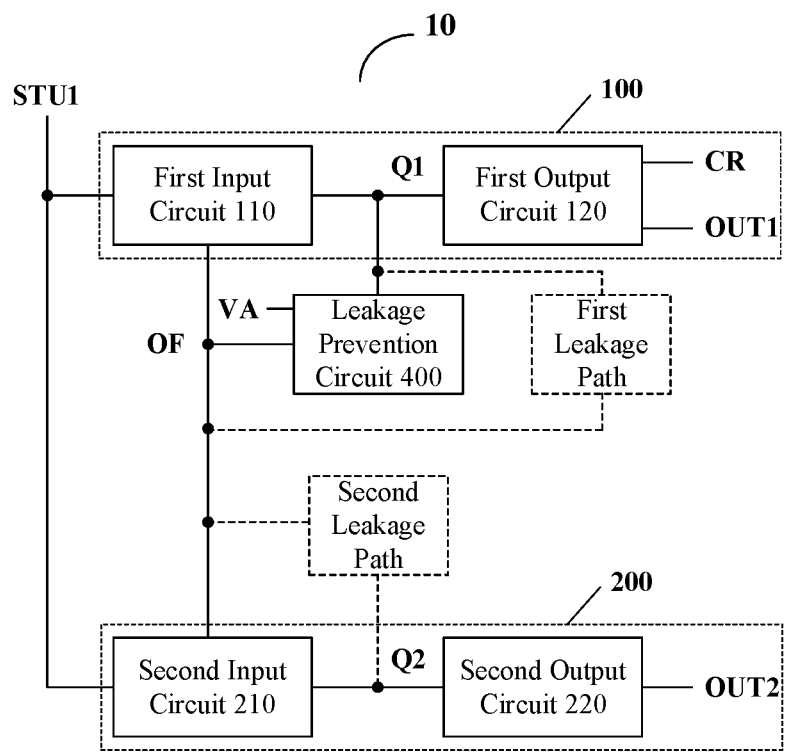
FIG. 2 is a schematic diagram of a shift register unit provided by some embodiments of the present disclosure.

At least one embodiment of the present disclosure provides a shift register unit 10, as illustrated in FIG. 2, the shift register unit 10 includes a first sub-circuit 100, a second sub-circuit 200, and a leakage prevention circuit 400, the first sub-circuit 100 includes a first input circuit 110 and a first output circuit 120, and the second sub-circuit 200 includes a second input circuit 210 and a second output circuit 220. A plurality of the shift register units 10 may be cascaded to form a gate driving circuit provided by an embodiment of the present disclosure, and the gate driving circuit may be used for a display device to provide scan signals during the display process of one frame of the display device.

The first input circuit 110 is configured to control the level of a first node Q1 in response to a first input signal STU1, for example, to charge the first node Q1. For example, the first input circuit 110 may be configured to receive the first input signal STU1 and a second voltage VDD, the first input circuit 110 is turned on in response to the first input signal STU1, so that the first node Q1 may be charged using the second voltage VDD. For another example, the first input circuit 110 may not receive the second voltage VDD, and directly charges the first node Q1 using the first input signal STU1.

It should be noted that, in some embodiments of the present disclosure, the second voltage VDD is, for example, at a high level, and the following embodiments are the same and will not be described in detail.

The first output circuit 120 is configured to output a shift signal CR and a first output signal OUT1 under the control of the level of the first node Q1. For example, the first output circuit 120 may be configured to receive a second clock signal CLKB and a third clock signal CLKC, and when the first output circuit 120 is turned on under the control of the level of the first node Q1, the second clock signal CLKB is output as the shift signal CR, and the third clock signal CLKC is output as the first output signal OUT1.

For example, in a display period of one frame, the shift signal CR output by the first output circuit 120 may be provided to other shift register unit 10 as the first input signal STU1, thereby completing the progressive shift of the display scanning. The first output signal OUT1 output by the first output circuit 120 can drive a row of sub-pixel units in the display panel to perform the display scanning.

It should be noted that, during the display period of one frame, the signal waveforms of the shift signal CR and the first output signal OUT1 output by the first output circuit 120 may be the same or different, which is not limited in the embodiments of the present disclosure.

The second input circuit 210 is configured to control the level of a second node Q2 in response to the first input signal STU1 while the first input circuit 110 controls the level of the first node Q1, for example, the second node Q2 is charged. For example, the second input circuit 210 may be configured to receive the first input signal STU1 and the second voltage VDD, and the first input signal STU1 is the same signal as the first input signal STU1 received by the first input circuit 110. The second input circuit 210 is turned on in response to the first input signal STU1, so that the second node Q2 may be charged using the second voltage VDD. For another example, the second input circuit 210 may not receive the second voltage VDD, and directly charges the second node Q2 using the first input signal STU1.

In the shift register units 10 provided by some embodiments of the present disclosure, when the first input signal STU1 is at a high level, the first input circuit 110 and the second input circuit 210 may simultaneously receive the first input signal STU1, so that the first input signal STU1 may simultaneously control the level of the first node Q1 and the level of the second node Q2, for example, simultaneously charge the first node Q1 and the second node Q2.

The second output circuit 220 is configured to output a second output signal OUT2 under the control of the level of the second node Q2. For example, the second output circuit 220 may be configured to receive a fourth clock signal CLKD, and when the second output circuit 220 is turned on under the control of the level of the second node Q2, the fourth clock signal CLKD may be output as the second output signal OUT2.

For example, in the display period of one frame, the second output signal OUT2 output by the second output circuit 220 may drive a row of sub-pixel units in the display panel to perform display scanning.

For example, in the case where a plurality of the shift register units 10 are cascaded to form a gate driving circuit, some of the shift register units 10 may be connected to a clock signal line to receive the first input signal STU1 provided by the clock signal line; alternatively, some of the shift register units 10 may also receive the shift signal CR output by the shift register unit 10 of other stage as the first input signal STU1.

The shift register unit 10 provided by the embodiment of the present disclosure can simultaneously charge a plurality of sub-circuits (the first sub-circuit 100 and the second sub-circuit 200, etc.), and only one sub-circuit (for example, the first sub-circuit 100) needs to output the shift signal, while other sub-circuits (such as the second sub-circuit 200, etc.) do not need to output the shift signal, thereby saving the number of clock signal lines and transistors, and thus reducing the bezel size of the display device adopting the shift register unit 10, and improving the PPI of the display device.

It should be noted that FIG. 2 is only an example of the present disclosure, and the embodiments of the present disclosure do not limit the number of sub-circuits included in the shift register unit 10, for example, may include three, four, or more sub-circuits, and the number of sub-circuits can be set according to the actual situation.

As illustrated in FIG. 2, the leakage prevention circuit 400 is connected to the first node Q1, and is configured to control the level of a leakage prevention node OF under the control of the level of the first node Q1, so that the circuit connected between the first node Q1 and the leakage prevention node OF is turned off, and the circuit connected between the second node Q2 and the leakage prevention node OF is turned off.

As illustrated in FIG. 2, in the shift register unit 10 provided by some embodiments of the present disclosure, for example, the first leakage path may be a reset circuit connected to the first node Q1, assuming that there is no leakage prevention circuit 400, when the first node Q1 is at a high level, the levels of two ends of the reset circuit in the first leakage path are the high level of the first node Q1 and a third voltage VGL1 at a low level, respectively, so that the voltage difference of the two ends of the reset circuit is large, and the first node Q1 is more likely to leak through the reset circuit. In addition, in the case where the reset circuit is not required to work, the control terminal of the reset circuit may be caused to receive the low-level third voltage VGL1.

For example, in the case where the shift register unit 10 includes the leakage prevention circuit 400, the leakage prevention circuit 400 may be configured to receive a high-level first voltage VA, and when the level of the first node Q1 is a high level, the leakage prevention circuit 400 is turned on under the control of the level of the first node Q1, so that the high-level first voltage VA may be transmitted to the leakage prevention node OF, and the level of the leakage prevention node OF becomes higher, for example, the level of the leakage node OF is higher than the third voltage VGL1.

It should be noted that in some embodiments of the present disclosure, the first voltage VA is, for example, a high level, the second voltage VDD is, for example, a high level, and the first voltage VA and the second voltage VDD may be the same or different. The third voltage VGL1 is, for example, a low level, for example, the third voltage VGL1 may be a negative level or zero volt. The following embodiments are the same and will not be repeated herein.

After the leakage prevention circuit 400 is turned on under the control of the level of the first node Q1, the level of the leakage prevention node OF may be made higher than the third voltage VGL1 under the control of the leakage prevention circuit 400, so that the circuit (for example, a reset circuit) in the first leakage path is turned off under the control of the level of the leakage prevention node OF and the third voltage VGL1, thereby turning off the circuit connected between the first node Q1 and the leakage prevention node OF, and the leakage of the first node Q1 through the first leakage path can be avoided, or the degree of the leakage may be reduced.

In the shift register units 10 provided by some embodiments of the present disclosure, by controlling the level of the leakage prevention node OF by the leakage prevention circuit 400, the leakage of the first node Q1 through the circuit connected between the first node Q1 and the leakage prevention node OF can be avoided, or the degree of the leakage may be reduced.

Similarly, as illustrated in FIG. 2, in the shift register unit 10 provided by the embodiment of the present disclosure, for example, the second leakage path may be a reset circuit connected to the second node Q2, assuming that there is no leakage prevention circuit 400, when the second node Q2 is at a high level, the levels of two ends of the reset circuit in the second leakage path are the high level of the second node Q2 and the third voltage VGL1 at a low level, respectively, so that the voltage difference of the two ends of the reset circuit is large, and the second node Q2 is more likely to leak through the reset circuit. In addition, in the case where the reset circuit is not required to work, the control terminal of the reset circuit may be caused to receive the low-level third voltage VGL1.

For example, in the case where the shift register unit 10 includes the leakage prevention circuit 400, the leakage prevention circuit 400 may be configured to receive the high-level first voltage VA. The first input signal STU1 simultaneously charges the first node Q1 and the second node Q2, so when the second node Q2 is at a high level, the first node Q1 is also at a high level, and the leakage prevention circuit 400 is turned on under the control of the level of the first node Q1, so that the high-level first voltage VA may be transmitted to the leakage prevention node OF, and the level of the leakage prevention node OF becomes higher, for example, the level of the leakage node OF is higher than the third voltage VGL1.

The level of the leakage prevention node OF may be made higher than the third voltage VGL1 under the control of the leakage prevention circuit 400, so that the circuit (for example, a reset circuit) in the second leakage path is turned off under the control of the level of the leakage prevention node OF and the third voltage VGL1, thereby turning off the circuit connected between the second node Q2 and the leakage prevention node OF, and the leakage of the second node Q2 through the second leakage path can be avoided, or the degree of the leakage may be reduced.

In the shift register units 10 provided by some embodiments of the present disclosure, by controlling the level of the leakage prevention node OF by the leakage prevention circuit 400, the leakage of the second node Q2 through the circuit connected between the second node Q2 and the leakage prevention node OF can be avoided, or the degree of the leakage may be reduced.

The shift register unit 10 provided by some embodiments of the present disclosure is provided with one leakage prevention circuit 400, and enables the first sub-circuit 100 and the second sub-circuit 200 to share the same leakage prevention node OF, so that the leakage of the first node Q1 and the second node Q2 can be avoided simultaneously. In addition, by sharing the leakage prevention node OF, the first sub-circuit 100 and the second sub-circuit 200 can also simplify the circuit structure, so that the bezel size of the display device adopting the shift register unit may be reduced, and the PPI of the display device may be improved.

In addition, it should be noted that in the embodiments of the present disclosure, the high level and the low level are described relatively. The high level represents a relatively higher voltage range (for example, the high level may adopt 5V, 10V, or other appropriate voltage), and multiple high levels may be same or different. Similarly, the low level represents a lower voltage range (for example, the low level may adopt 0V, −5V, −10V, or other appropriate voltage), and multiple low levels can be same or different. For example, the minimum value of the high level is greater than the maximum value of the low level.

It should be noted that, in the embodiments of the present disclosure, controlling a level of a node (for example, the first node Q1, the second node Q2, etc.) including charging the node to pull up the level of the node, or discharging the node to pull down the level of the node. For example, a capacitor may be set to be electrically connected to the node, and charging the node means charging the capacitor electrically connected to the node; similarly, discharging the node means discharging the capacitor electrically connected to the node. The high level or the low level of the node may be maintained by the capacitor.

As illustrated in FIG. 2, in the shift register unit 10 provided by some embodiments of the present disclosure, the first input circuit 110 is connected to the first node Q1 and the leakage prevention node OF, and is also configured to control the level of the leakage prevention node OF in respond to the input signal STU1; the second input circuit 210 is connected to the second node Q2 and the leakage prevention node OF, and is configured to transmit the level of the leakage prevention node OF to the second node Q2 in response to the first input signal STU1.

For example, when the first input signal STU1 is at a high level, both the first input circuit 110 and the second input circuit 210 may be turned on under the control of the first input signal STU1. The first input signal STU1 charges the first node Q1 after passing through the first input circuit 110, and at the same time, the first input signal STU1 may also charge the second node Q2 after passing through the first input circuit 110, the leakage prevention node OF, and the second input circuit 210. That is, the first input circuit 110 and the second input circuit 210 are electrically connected through the leakage prevention node OF, and the first input circuit 110 is multiplexed during the charging process of the first node Q1 and the second node Q2.

In addition, according to the above description of the leakage prevention node OF, because the first input circuit 110 is connected between the first node Q1 and the leakage prevention node OF, the leakage of the first node Q1 through the first input circuit 110 can be avoided, or the degree of leakage is reduced. For example, after the first node Q1 is charged to a high level, if the first input signal STU1 becomes a low level, then the first node Q1 may be prevented from leaking through the first input circuit 110 at this time.

Similarly, because the second input circuit 210 is connected between the second node Q2 and the leakage prevention node OF, the leakage of the second node Q2 through the second input circuit 210 can be avoided, or the degree of leakage is reduced. For example, after the second node Q2 is charged to a high level, if the first input signal STU1 becomes a low level, then the second node Q2 may be prevented from leaking through the second input circuit 210 at this time.

In the shift register units provided by some embodiments of the present disclosure, by enabling the first input circuit 110 and the second input circuit 210 both electrically connected to the leakage prevention node OF, the leakage of the first node Q1 through the first input circuit 110 can be avoided, and the leakage of the second node Q2 through the second input circuit 210 can be avoided. In addition, when charging the first node Q1 and the second node Q2, the first input circuit 110 may also be multiplexed, so that the circuit structure may be simplified, the bezel size of the display device adopting the shift register unit may be reduced, and the PPI of the display device may further be improved.

Figure 3:
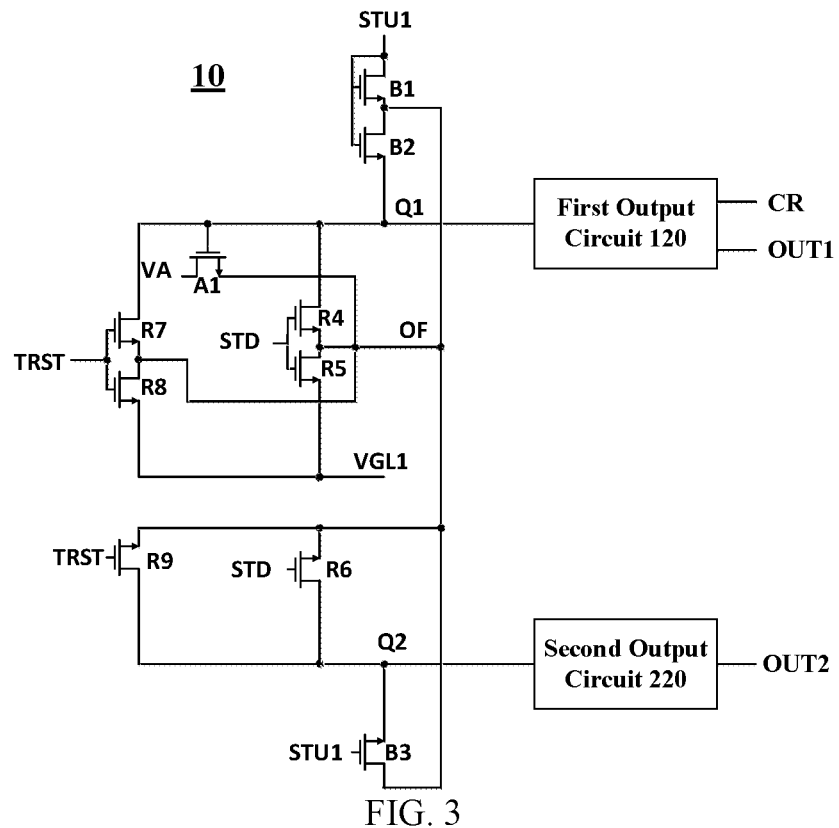
FIG. 3 is a schematic diagram of another shift register unit provided by some embodiments of the present disclosure.

As illustrated in FIG. 3, in the shift register unit 10 provided by some embodiments of the present disclosure, the leakage prevention circuit 400 includes a first leakage prevention transistor A1, the first input circuit 110 includes a first input transistor B1 and a second input transistor B2, and the second input circuit 210 includes a third input transistor B3.

The gate electrode of the first leakage prevention transistor A1 is connected to the first node Q1, the first electrode of the first leakage prevention transistor A1 is configured to receive the first voltage VA, and the second electrode of the first leakage prevention transistor A1 is connected to the leakage prevention node OF. For example, when the level of the first node Q1 is a high level, the first leakage prevention transistor A1 is turned on, so that the level of the leakage prevention node OF may be controlled using the first voltage VA, for example, the leakage prevention node OF is charged using the first voltage VA to cause the level of the leakage prevention node OF to become high.

The gate electrode and the first electrode of the first input transistor B1 are configured to receive the first input signal STU1, and the second electrode of the first input transistor B1 is connected to the leakage prevention node OF.

The gate electrode of the second input transistor B2 is configured to receive the first input signal STU1, the first electrode of the second input transistor B2 is connected to the leakage prevention node OF, and the second electrode of the second input transistor B2 is connected to the first node Q1.

The gate electrode of the third input transistor B3 is configured to receive the first input signal STU1, the first electrode of the third input transistor B3 is connected to the leakage prevention node OF, and the second electrode of the third input transistor B3 is connected to the second node Q2.

As illustrated in FIG. 3, when the first input signal STU1 is at a high level, the first input transistor B1, the second input transistor B2, and the third input transistor B3 are all turned on, the first input signal STU1 charges the first node Q1 through the first input transistor B1 and the second input transistor B2, and at the same time, the first input signal STU1 charges the second node Q2 through the first input transistor B1 and the third input transistor B3. Therefore, the first input transistor B1 is multiplexed.

For example, after the first input signal STU1 completes the charging operation of the first node Q1 and the second node Q2, the first input signal STU1 changes from a high level to a predetermined low level, for example, the predetermined low level is the third voltage VGL1. By providing the first leakage prevention transistor A1, when the level of the first node Q1 is a high level, the level of the leakage prevention node OF is made to be higher than the third voltage VGL1, so that $V_{gs}$ (voltage difference between the gate electrode and the source electrode) of the second input transistor B2 is caused to be less than zero, so that the second input transistor B2 is kept to be turned off. In addition, because the level of the leakage prevention node OF becomes higher (higher than the third voltage VGL1), the voltage difference between the first node Q1 and the leakage prevention node OF becomes smaller (even negative), so that the first node Q1 cannot leak through the second input transistor B2, or the degree of the leakage may be reduced. Based on the same principle as the first node Q1 described above, the second node Q2 cannot leak through the third input transistor B3, or the degree of the leakage may be reduced.

In the shift register units 10 provided by some embodiments of the present disclosure, on the basis of implementing leakage prevention, the first input transistor B1 may be multiplexed in the case of that the first input circuit 110 and the second input circuit 210 shares the leakage prevention node OF, so that the number of transistors may be saved, the bezel size of the display device adopting the shift register unit may be reduced, and the PPI of the display device may further be improved.

For example, as illustrated in FIG. 3, the shift register unit 10 further includes a fourth reset transistor R4, a fifth reset transistor R5, a seventh reset transistor R7, and an eighth reset transistor R8 that reset the first node Q1, and a sixth reset transistor R6 and a ninth reset transistor R9 that reset the second node Q2.

For example, the gate electrodes of the fourth reset transistor R4, the fifth reset transistor R5, and the sixth reset transistor R6 are all configured to receive the display reset signal STD. When the display reset signal STD is at a high level, the fourth reset transistor R4, the fifth reset transistor R5, and the sixth reset transistor R6 are turned on, so that the low-level third voltage VGL1 may reset the first node Q1 through the fifth reset transistor R5 and the fourth reset transistor R4, and the low-level third voltage VGL1 may reset the second node Q2 through the fifth reset transistor R5 and the sixth reset transistor R6. Therefore, the fifth reset transistor R5 is multiplexed.

For example, the gate electrodes of the seventh reset transistor, the eighth reset transistor R8, and the ninth reset transistor R9 are all configured to receive the total reset signal TRST. When the total reset signal TRST is at a high level, the seventh reset transistor, the eighth reset transistor R8, and the ninth reset transistor R9 are turned on, so that the low-level third voltage VGL1 may reset the first node Q1 through the eighth reset transistor R8 and the seventh reset transistor R7, and the low-level third voltage VGL1 may reset the second node Q2 through the eighth reset transistor R8 and the ninth reset transistor R9. Therefore, the eighth reset transistor R8 is multiplexed. It should be noted that the display reset signal STD and the total reset signal TRST will be described in detail below, and will not be repeated here.

For example, when the first node Q1 is at a high level, the display reset signal STD provided to the fourth reset transistor R4 and the total reset signal TRST provided to the seventh reset transistor R7 may be made a predetermined low level at this time, for example, the predetermined low level is the third voltage VGL1, so that the fourth reset transistor R4 and the seventh reset transistor R7 are turned off. If the fourth reset transistor R4 and the seventh reset transistor R7 cannot be completely turned off, the first node Q1 may leak through the fourth reset transistor R4 or the seventh reset transistor R7.

As illustrated in FIG. 3, by providing the first leakage prevention transistor A1, when the level of the first node Q1 is a high level, the potential of the leakage prevention node OF is made to be higher than the third voltage VGL1, so that relative to the display reset signal STD or the total reset signal TRST with a predetermined low level (for example, the third voltage VGL1), $V_{gs}$ (voltage difference between the gate electrode and the source electrode) of the fourth reset transistor R4 and $V_{gs}$ of the seventh reset transistor R7 are both caused to be less than zero, so that the fourth reset transistor R4 and the seventh reset transistor R7 are kept to be turned off. In addition, because the level of the leakage prevention node OF becomes higher (higher than the third voltage VGL1), the voltage difference between the first node Q1 and the leakage prevention node OF becomes smaller (even negative), so that the first node Q1 cannot leak through the fourth reset transistor R4 or the seventh reset transistor R7, or the degree of the leakage may be reduced.

Similarly, by providing the first leakage prevention transistor A1, when the level of the second node Q2 is a high level, the potential of the leakage prevention node OF is made to be higher than the third voltage VGL1, so that relative to the display reset signal STD or the total reset signal TRST with a predetermined low level (for example, the third voltage VGL1), Vgs (voltage difference between the gate electrode and the source electrode) of the sixth reset transistor R6 and Vgs of the ninth reset transistor R9 are both caused to be less than zero, so that the sixth reset transistor R6 and the ninth reset transistor R9 are kept to be turned off. In addition, because the level of the leakage prevention node OF becomes higher (higher than the third voltage VGL1), the voltage difference between the second node Q2 and the leakage prevention node OF becomes smaller (even negative), so that the second node Q2 cannot leak through the sixth reset transistor R6 or the ninth reset transistor R9, or the degree of the leakage may be reduced.

In the shift register units 10 provided by some embodiments of the present disclosure, on the basis of implementing leakage prevention, the fifth reset transistor R5 and the eighth reset transistor R8 may be multiplexed when performing the reset operation on the first node Q1 and the second node Q2, so that the number of transistors may be saved, the bezel size of the display device adopting the shift register unit may be reduced, and the PPI of the display device may further be improved.

It should be noted that, in FIG. 3, in order to explain the working principle of leakage prevention, regarding the possible leakage path of the first node Q1, only the second input transistor B2, the fourth reset transistor R4, and the seventh reset transistor R7 are illustrated. In the case of that there is another circuit connected to the first node Q1, in order to avoid the leakage of the first node Q1 through the circuit, as long as the circuit is connected to the leakage prevention node OF. Regarding the possible leakage path of the second node Q2, only the third input transistor B3, the sixth reset transistor R6, and the ninth reset transistor R9 are illustrated. In the case of that there is another circuit connected to the second node Q2, in order to avoid the leakage of the second node Q2 through the circuit, as long as the circuit is connected to the leakage prevention node OF.

That is, in the shift register units 10 provided by some embodiments of the present disclosure, by providing the first leakage prevention transistor A1, when the level of the first node Q1 is a high level, the circuit connected between the first node Q1 and the leakage prevention node OF may be caused to be turned off, so that the leakage of the first node Q1 can be avoided, or the degree of leakage may be reduced; when the second node Q2 is at a high level, the circuit connected between the second node Q2 and the leakage prevention node OF may be caused to be turned off, so that the leakage of the second node Q2 can be avoided, or the degree of leakage may be reduced.

It should be noted that, the transistors illustrated in FIG. 3 are all described using N-type transistors as an example.

It should be noted that each of the transistors adopted in the embodiments of the present disclosure may be a thin film transistor, a field effect transistor or other switching component having the same characteristics. In the embodiments of the present disclosure, the thin film transistor is taken as an example for description. The source electrode and the drain electrode of the transistor used here may be structurally symmetrical, so that the source electrode and the drain electrode may be structurally indistinguishable. In the embodiments of the present disclosure, in order to distinguish the two electrodes of the transistor except the gate electrode, one electrode is directly described as the first electrode, and the other electrode is described as the second electrode. In addition, the transistors can be divided into N-type and P-type transistors according to the characteristics of the transistors. In the case where the transistor is the N-type transistor, the turn-on voltage is a high-level voltage (e.g., 5V, 10V, or other suitable voltage), and the turn-off voltage is a low-level voltage (e.g., 0V, −5V, −10V, or other suitable voltage). The transistors in the following embodiments are also described using N-type transistors as an example, and will not be described in detail. However, the embodiments of the present disclosure include but are not limited thereto. For example, one or more transistors in the shift register unit provided by the embodiments of the present disclosure may also adopt P-type transistors. In the case where the transistor is the P-type transistor, the turn-on voltage is a low-level voltage (for example, 0V, −5V, −10V or other suitable voltage), and the turn-off voltage is a high-level voltage (for example, 5V, 10V or other suitable voltage).

When compensating a sub-pixel unit in the OLED display panel, in addition to setting a pixel compensation circuit in the sub-pixel unit for internal compensation, external compensation may also be performed by setting a sensing transistor. When the external compensation is performed, the gate driving circuit formed by the shift register units needs to provide the sub-pixel unit in the display panel with a driving signal for a scanning transistor and a driving signal for the sensing transistor, respectively. For example, the gate driving circuit provides a scan driving signal for the scanning transistor in a display period of one frame, and provides a sense driving signal for the sensing transistor in a blanking period of one frame.

In an external compensation method, the sense driving signal output by the gate driving circuit is sequentially scanned line by line. For example, the sense driving signal for the first row of the sub-pixel units in the display panel is output during the blanking period of the first frame, the sense driving signal for the second row of the sub-pixel units in the display panel is output during the blanking period of the second frame, and so on, the sense driving signal is sequentially output line by line in the frequency of that the sense driving signal corresponding to one row of sub-pixel units is output during each frame, that is, the progressive sequence compensation of the display panel is completed.

However, in the case where the above progressive sequence compensation method is performed, the problem of poor display may occur: one is that there is a scanning line that moves line by line during the display scanning process of multiple frames; the other one is that the difference of time points for the external compensation may cause the difference of brightness in different regions of the display panel to be large. For example, when performing the external compensation on the 100th row of the sub-pixel units in the display panel, although the 10th row of the sub-pixel units in the display panel has been performed the external compensation, however, at this time, the light-emission brightness of the 10th row of the sub-pixel units may have changed, for example, the light-emission brightness is reduced, which may cause uneven brightness in different regions of the display panel, and this problem is more obvious in large-size display panels.

As described above, in the case where the gate driving circuit drives a display panel, in order to implement the external compensation, the gate driving circuit needs to not only output the scan driving signal for the display period, but also output the sense driving signal for the blanking period.

It should be noted that, in some embodiments of the present disclosure, the random compensation refers to an external compensation method that is different from the progressive sequence compensation, that is, the sense driving signal corresponding to any one row of the sub-pixel units in the display panel is output randomly during the blanking period of a frame, and the following embodiments are the same and will not be described in detail.

In addition, in some embodiments of the present disclosure, for the purpose of description, the term "one frame", "each frame" or "a frame" includes a display period and a blanking period which are sequentially performed. For example, in the display period, the gate driving circuit outputs a driving signal, and the driving signal can drive the display panel from the first row to the last row to perform a display scanning of one complete image; and in the blanking period, the gate driving circuit outputs a driving signal, and the driving signal can be used to drive sensing transistors in one row of sub-pixel units in the display panel to perform the external compensation on the sub-pixel units in the row.

Figure 4:
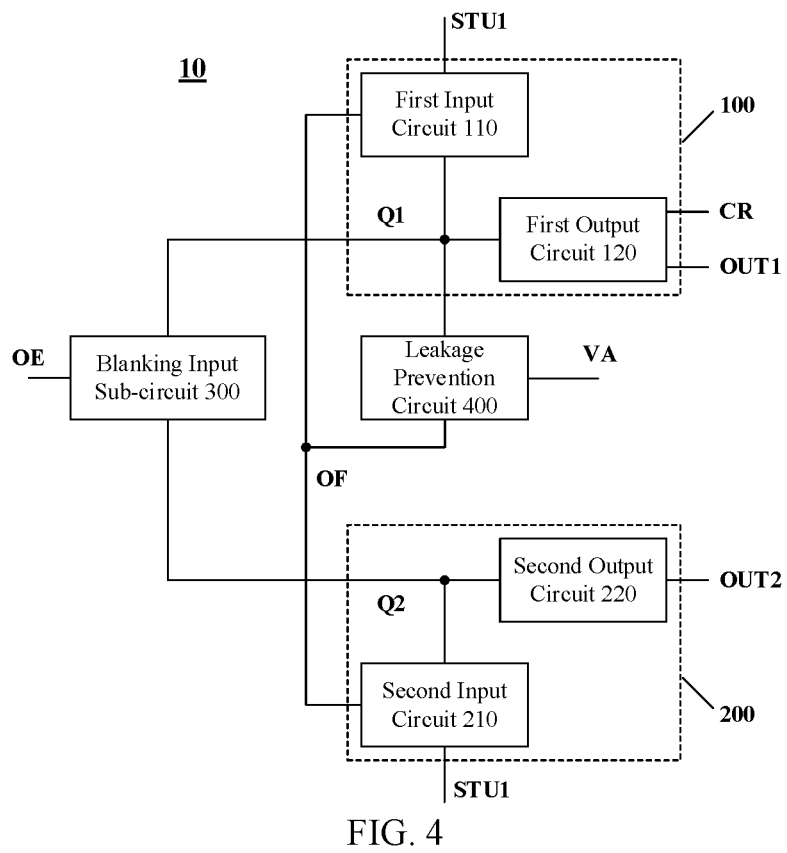
FIG. 4 is a schematic diagram of yet another shift register unit provided by some embodiments of the present disclosure.

In order to implement the above random compensation, as illustrated in FIG. 4, in some embodiments of the present disclosure, the shift register unit 10 further includes a blanking input sub-circuit 300. The blanking input sub-circuit 300 is connected to the first node Q1 and the second node Q2, and is configured to receive a selection control signal OE, and control the level of the first node Q1 and the level of the second node Q2, for example, to charge the first node Q1 and the second node Q2.

For example, in the blanking period of one frame, the blanking input sub-circuit 300 may charge the first node Q1 and the second node Q2, so that the first output circuit 120 outputs the first output signal OUT1 under the control of the level of the first node Q1, or the second output circuit 220 outputs the second output signal OUT2 under the control of the level of the second node Q2. The first output signal OUT1 or the second output signal OUT2 may be used to drive the sensing transistors in a row of sub-pixel units in the display panel to complete the external compensation of the row of sub-pixel units.

The gate driving circuit and the display device adopting the shift register unit 10 provided by the embodiments of the present disclosure can implement the random compensation, thereby avoiding the problems of poor display such as the scanning lines and the uneven display brightness due to the progressive sequence compensation.

Figure 5:
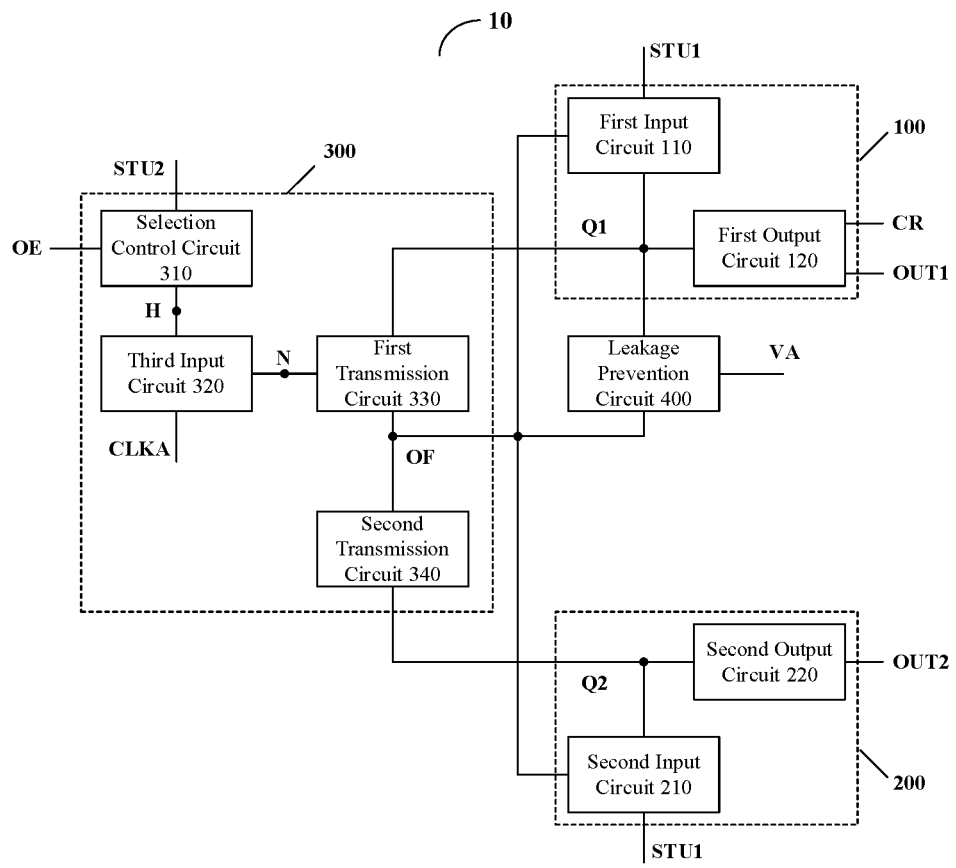
FIG. 5 is a schematic diagram of yet another shift register unit provided by some embodiments of the present disclosure.

As illustrated in FIG. 5, in some embodiments of the present disclosure, the blanking input sub-circuit 300 includes a selection control circuit 310, a third input circuit 320, a first transmission circuit 330, and a second transmission circuit 340.

The selection control circuit 310 is configured to control the level of a third node H using a second input signal STU2 in response to the selection control signal OE, for example, charge the third node H and maintain the level of the third node H. For example, in the display period of one frame, the selection control circuit 310 may be turned on under the control of the selection control signal OE, thereby charging the third node H with the second input signal STU2. The level (e.g., a high level) of the third node H may be maintained from the display period of one frame to the blanking period of the frame.

For example, in the case where a plurality of shift register units 10 are cascaded to form the gate driving circuit, the shift register unit 10 of a certain stage may receive the shift signal CR output by the shift register unit 10 of other stage as the second input signal STU2. For example, in the case where it is necessary to select the shift register unit 10 of a certain stage to output the driving signal in the blanking period of one frame, the waveform timings of the selection control signal OE and the second input signal STU2 provided to the shift register unit 10 of the stage can be made the same, so that the selection control circuit 310 in the shift register unit 10 of the stage is turned on.

The third input circuit 320 is configured to transmit a first clock signal CLKA to a fourth node N under the control of the level of the third node H. For example, the third input circuit 320 may be configured to receive the first clock signal CLKA. When the third input circuit 320 is turned on under the control of the level of the third node H, the first clock signal CLKA is transmitted to the fourth node N, thereby controlling the level of the fourth node N. For example, during the blanking period of one frame, when the first clock signal CLKA is at a high level, the third input circuit 320 may transmit the high level to the fourth node N, so that the level of the fourth node N is caused to become high.

The first transmission circuit 330 is electrically connected to the first node Q1, the fourth node N, and the leakage prevention node OF, and is configured to control the level of the first node Q1 and the level of the leakage prevention node OF in respond to the first clock signal CLKA. For example, in some embodiments, the first transmission circuit 330 may be configured to receive the first clock signal CLKA, and when the first transmission circuit 330 is turned on under the control of the first clock signal CLKA, the level of the fourth node N is transmitted to the first node Q1 to control the level of the first node Q1, for example, to charge the first node Q1. In addition, when the first transmission circuit 330 is turned on under the control of the first clock signal CLKA, the level of the fourth node N is also transmitted to the leakage prevention node OF, thereby controlling the level of the leakage prevention node OF.

The second transmission circuit 340 is electrically connected to the second node Q2 and the leakage prevention node OF, and is configured to transmit the level of the leakage prevention node OF to the second node Q2 in response to the first clock signal CLKA. For example, in some embodiments, the second transmission circuit 340 may be configured to receive the first clock signal CLKA, and when the second transmission circuit 340 is turned on under the control of the first clock signal CLKA, the level of the leakage prevention node OF is transmitted to the second node Q2 to control the level of the second node Q2, for example, to charge the second node Q2.

It should be noted that, in the embodiments of the present disclosure, the blanking input sub-circuit 300 is provided in the shift register unit 10 in order to implement that the driving signal can be output during the blanking period of one frame. "Blanking" in the blanking input sub-circuit 300 only means that it is related to the blanking period in one frame, and does not limit that the blanking input sub-circuit 300 only works in the blanking period. The following embodiments are the same and will not be described in detail.

In the shift register units 10 provided by some embodiments of the present disclosure, the first transmission circuit 330 and the second transmission circuit 340 are electrically connected through the leakage prevention node OF. When the first transmission circuit 330 charges the first node Q1, the high level of the fourth node N may also be transmitted to the second node Q2 through the leakage prevention node OF, thereby implementing the charging of the second node Q2. In addition, because both the first transmission circuit 330 and the second transmission circuit 340 are electrically connected to the leakage prevention node OF, the leakage of the first node Q1 through the first transmission circuit 330 can be avoided, and the leakage of the second node Q2 through the second transmission circuit 340 can also be avoided.

In addition, in the case where the shift register unit 10 includes three, four, or more sub-circuits, accordingly, three, four, or more transmission circuits need to be provided to implement the function of the blanking input sub-circuit 300.

In some embodiments of the present disclosure, in the case where the shift register unit 10 includes a plurality of sub-circuits (the first sub-circuit 100 and the second sub-circuit 200, etc.), these sub-circuits may share one blanking input sub-circuit 300, so that the area occupied by the shift register unit 10 is reduced, and the bezel size of the display device adopting the shift register unit is reduced, thereby improving the PPI of the display device.

As illustrated in FIG. 6, and FIG. 7A to FIG. 7C, in some embodiments, the selection control circuit 310 may be implemented to include a fourth input transistor B4 and a first capacitor C1. The gate electrode of the fourth input transistor B4 is configured to receive the selection control signal OE, the first electrode of the fourth input transistor B4 is configured to receive the second input signal STU2, and the second electrode of the fourth input transistor B4 is connected to the third node H. For example, when the selection control signal OE is a high-level turn-on signal, the fourth input transistor B5 is turned on, so that the third node H may be charged using the second input signal STU2.

The first electrode of the first capacitor C1 is connected to the third node H, the second electrode of the first capacitor C1 is configured to receive the third voltage VGL1, or the second electrode of the first capacitor C1 is configured to receive the second voltage VDD. By providing the first capacitor C1, the potential of the third node H may be maintained. For example, in the display period of one frame, the selection control circuit 310 charges the third node H to pull up the third node H to a high potential, then the first capacitor C1 may maintain the high potential of the third node H until the blanking period of the frame.

Figure 6:
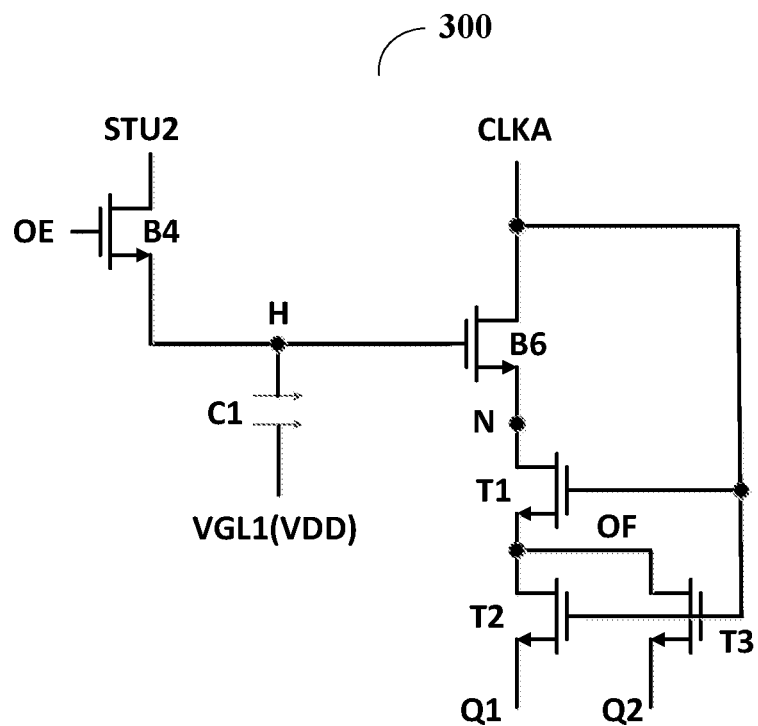
FIG. 6 is a circuit diagram of a blanking input sub-circuit provided by some embodiments of the present disclosure.

For example, in the embodiment illustrated in FIG. 6, the third input circuit 320 may be implemented as the sixth input transistor B6. The gate electrode of the sixth input transistor B6 is connected to the third node H, the first electrode of the sixth input transistor B6 is configured to receive the first clock signal CLKA, and the second electrode of the sixth input transistor B6 is connected to the fourth node N. For example, when the third node H is at a high level, the sixth input transistor B6 is turned on, so that the fourth node N may be charged using the first clock signal CLKA to pull up the level of the fourth node N.

For example, in the embodiment illustrated in FIG. 6, the first transmission circuit 330 includes a first transmission transistor T1 and a second transmission transistor T2, and the second transmission circuit 340 includes a third transmission transistor T3.

The gate electrode of the first transmission transistor T1 is configured to receive the first clock signal CLKA, the first electrode of the first transmission transistor T1 is connected to the fourth node N, and the second electrode of the first transmission transistor T1 is connected to the leakage prevention node OF. The gate electrode of the second transmission transistor T2 is configured to receive the first clock signal CLKA, the first electrode of the second transmission transistor T2 is connected to the leakage prevention node OF, and the second electrode of the second transmission transistor T2 is connected to the first node Q1. The gate electrode of the third transmission transistor T3 is configured to receive the first clock signal CLKA, the first electrode of the third transmission transistor T3 is connected to the leakage prevention node OF, and the second electrode of the third transmission transistor T3 is connected to the second node Q2.

For example, when the first clock signal CLKA is at a high level, the first transmission transistor T1, the second transmission transistor T2, and the third transmission transistor T3 are all turned on, and the first transmission transistor T1 that is turned on may transmit the high level of the fourth node N to the leakage prevention node OF, so that the level of the leakage prevention node OF becomes a high level; then the second transmission transistor T2 that is turned on transmits the high level of the leakage prevention node OF to the first node Q1 to charge the first node Q1; the third transmission transistor T3 that is turned on transmits the high level of the leakage prevention node OF to the second node Q2 to charge the second node Q2. As described above, when charging the first node Q1 and the second node Q2, the first transmission transistor T1 is multiplexed. In addition, because the second transmission transistor T2 is connected to the leakage prevention node OF, the second transmission transistor T2 can also avoid the leakage of the first node Q1. Because the third transmission transistor T3 is connected to the leakage prevention node OF, the third transmission transistor T3 can also avoid the leakage of the second node Q2.

Figure 7A:
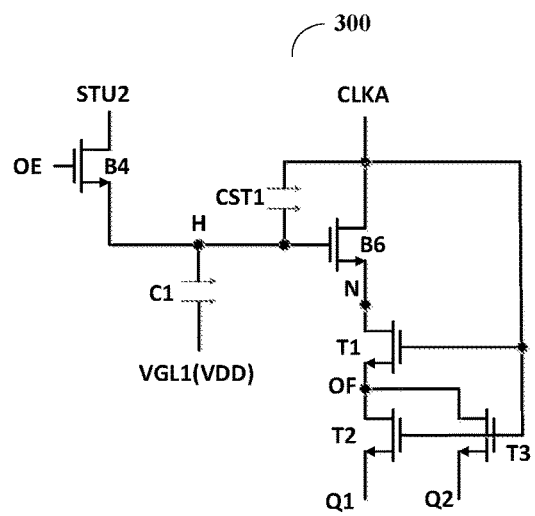
FIG. 7A to FIG. 7D are circuit diagrams of four blanking input sub-circuits provided by some embodiments of the present disclosure.
Figure 7B:
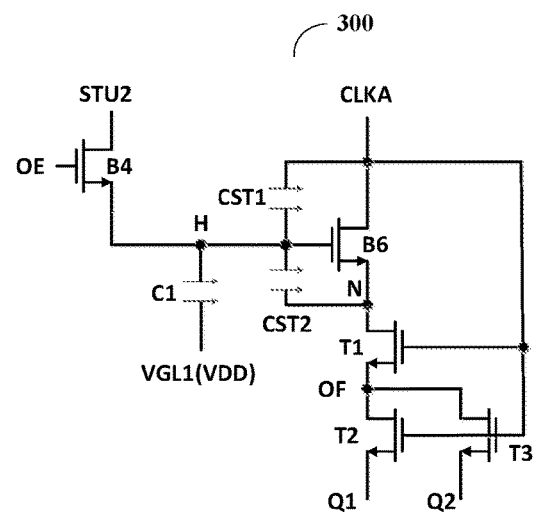
Figure 7C:
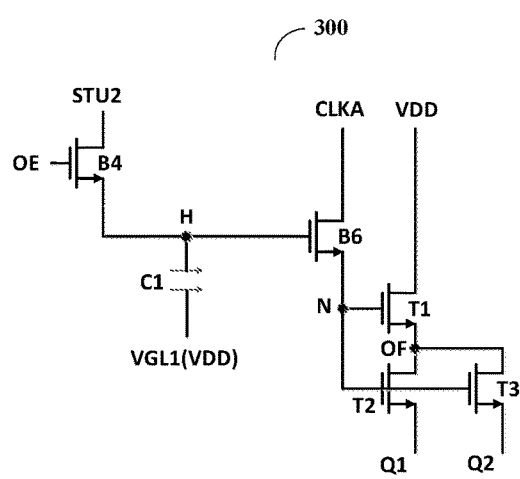

The blanking input sub-circuits 300 provided in FIG. 7A to FIG. 7C are described below. It should be noted that in the following description, the same parts of FIG. 7A to FIG. 7C and FIG. 6 will not be described in detail.

For example, as illustrated in FIG. 7A, relative to FIG. 6, the blanking input sub-circuit 300 further includes a first coupling capacitor CST1. The first electrode of the first coupling capacitor CST1 is configured to receive the first clock signal CLKA, and the second electrode of the first coupling capacitor CST1 is connected to the third node H. For example, when the first clock signal CLKA changes from a low level to a high level, the first clock signal CLKA may pull up, by coupling, the third node H by the coupling effect of the first coupling capacitor CST1, the level of the third node H is further pulled up, so that the sixth input transistor B6 may be ensured to be turned on more sufficiently.

For example, as illustrated in FIG. 7B, relative to FIG. 7A, the blanking input sub-circuit 300 further includes a second coupling capacitor CST2, the first electrode of the second coupling capacitor CST2 is connected to the third node H, and the second electrode of the second coupling capacitor CST2 is connected to the fourth node N. For example, when the first clock signal CLKA changes from a low level to a high level, if the sixth input transistor B6 is turned on at this time, the high-level first clock signal CLKA may be transmitted to the fourth node N through the sixth input transistor B6, so that the potential of the second electrode of the second coupling capacitor CST2 is pulled up, and the level of the third node H may further be pulled up by the bootstrap effect of the second coupling capacitor CST2, thereby ensuring the sixth input transistor B6 to be turned on more sufficiently.

For example, as illustrated in FIG. 7C, the first transmission circuit 330 includes a first transmission transistor T1 and a second transmission transistor T2, and the second transmission circuit 340 includes a third transmission transistor T3.

The gate electrode of the first transmission transistor T1 is connected to the fourth node N, the first electrode of the first transmission transistor T1 is configured to receive the high-level second voltage VDD, and the second electrode of the first transmission transistor T1 is connected to the leakage prevention node OF; the gate electrode of the second transmission transistor T2 is connected to the fourth node N, the first electrode of the second transmission transistor T2 is connected to the leakage prevention node OF, and the second electrode of the second transmission transistor T2 is connected to the first node Q1; The gate electrode of the third transmission transistor T3 is connected to the fourth node N, the first electrode of the third transmission transistor T3 is connected to the leakage prevention node OF, and the second electrode of the third transmission transistor T3 is connected to the second node Q2.

For example, when the first clock signal CLKA is at a high level, the high-level first clock signal CLKA is transmitted to the fourth node N through the sixth input transistor B6 that is turned on, so that the fourth node N becomes a high level, the first transmission transistor T1, the second transmission transistor T2, and the third transmission transistor T3 are all turned on, and the first transmission transistor T1 that is turned on may transmit the high-level second voltage VDD to the leakage prevention node OF, so that the level of the leakage prevention OF becomes a high level; then the second transmission transistor T2 that is turned on transmits the high level of the leakage prevention node OF to the first node Q1 to charge the first node Q1; the third transmission transistor T3 that is turned on transmits the high level of the leakage prevention node OF to the second node Q2 to charge the second node Q2.

Figure 7D:
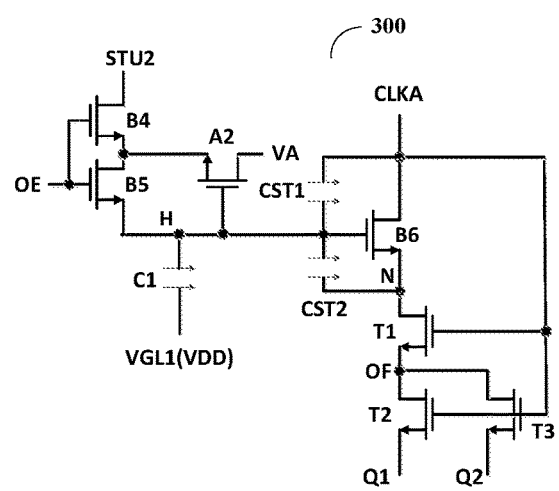

For example, FIG. 7D also provides a blanking input sub-circuit 300, relative to FIG. 7B, the selection control circuit 310 in the blanking input sub-circuit 300 includes a fifth input transistor B5 in addition to the fourth input transistor B4, in addition, the blanking input sub-circuit 300 further includes a second leakage prevention transistor A2.

As illustrated in FIG. 7D, the gate electrode of the second leakage prevention transistor A2 is connected to the third node H, the first electrode of the second leakage prevention transistor A2 is configured to receive the first voltage VA, and the second electrode of the second leakage prevention transistor A2 is connected to the first electrode of the fifth input transistor B5, the gate electrode of the fifth input transistor B5 is configured to receive the selection control signal OE, and the second electrode of the fifth input transistor B5 is connected to the third node H.

The second leakage prevention transistor A2 and the fifth input transistor B5 cooperate to prevent the leakage of the third node H. For the working principle of preventing the leakage of the third node H, reference may be made to the corresponding description about the first node Q1, which is not repeated here.

Figure 8:
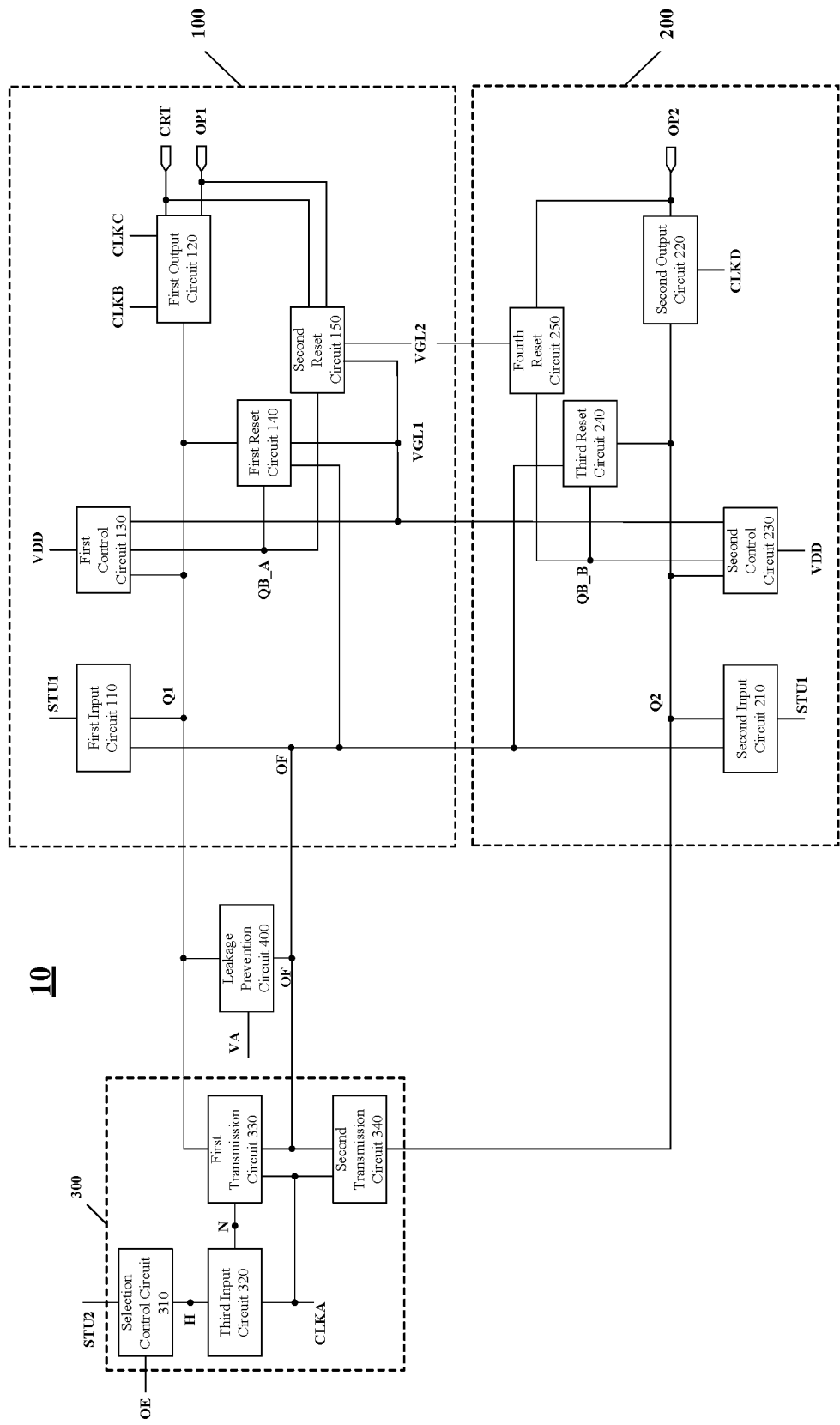
FIG. 8 is a schematic diagram of yet another shift register unit provided by some embodiments of the present disclosure.

As illustrated in FIG. 8, in the shift register units 10 provided by some embodiments of the present disclosure, the first sub-circuit 100 further includes a first control circuit 130, a first reset circuit 140, a second reset circuit 150, a shift signal output terminal CRT, and a first output signal terminal OP1. The shift signal output terminal CRT is configured to output the shift signal CR, and the first output signal terminal OP1 is configured to output the first output signal OUT1.

The first control circuit 130 is configured to control the level of a fifth node QB_A under the control of the level of the first node Q1 and the second voltage VDD. For example, the first control circuit 130 is connected to the first node Q1 and the fifth node QB_A, and is configured to receive the second voltage VDD and the third voltage VGL1. For example, when the first node Q1 is at a high level, the first control circuit 130 may pull down the fifth node QB_A to a low level using the low-level third voltage VGL1. For another example, when the first node Q1 is at a low level, the first control circuit 130 may charge the fifth node QB_A using the high-level second voltage VDD to pull up the fifth node QB_A to a high level.

The first reset circuit 140 is connected to the first node Q1 and the leakage prevention node OF, and is configured to reset the first node Q1 and the leakage prevention node OF under the control of the level of the fifth node QB_A. For example, the first reset circuit 140 is configured to receive the third voltage VGL1, and when the first reset circuit 140 is turned on under the control of the level of the fifth node QB_A, the first node Q1 and the leakage prevention node OF may be pulled down and reset using the low-level third voltage VGL1.

The second reset circuit 150 is configured to reset the shift signal output terminal CRT and the first output signal terminal OP1 under the control of the level of the fifth node QB_A. For example, the second reset circuit 150 is connected to the fifth node QB_A, the shift signal output terminal CRT, and the first output signal terminal OP1, and is configured to receive the third voltage VGL1 and the fourth voltage VGL2 (for example, at a low level). For example, when the second reset circuit 150 is turned on under the control of the level of the fifth node QB_A, the shift signal output terminal CRT may be pulled down and reset using the third voltage VGL1, and the first output signal terminal OP1 may also be pulled down and reset using the fourth voltage VGL2.

It should be noted that, in some embodiments of the present disclosure, the first output signal terminal OP1 may also be pulled down and reset using the third voltage VGL1, which is not limited in the present disclosure. In addition, in the embodiments of the present disclosure, the fourth voltage VGL2 is, for example, a low level, and the following embodiments are the same and will not be described in detail. In the embodiment of the present disclosure, the fourth voltage VGL2 may be the same as or different from the third voltage VGL1.

As illustrated in FIG. 8, the second sub-circuit 200 further includes a second control circuit 230, a third reset circuit 240, a fourth reset circuit 250, and a second output signal terminal OP2. The second output signal terminal OP2 is configured to output the second output signal OUT2.

The second control circuit 230 is configured to control the level of a sixth node QB_B under the control of the level of the second node Q2 and the second voltage VDD. For example, the second control circuit 230 is connected to the second node Q2 and the sixth node QB_B, and is configured to receive the second voltage VDD and the third voltage VGL1. For example, when the second node Q2 is at a high level, the second control circuit 230 may pull down the sixth node QB_B to a low level using the low-level third voltage VGL1. For another example, when the potential of the second node Q2 is at a low level, the second control circuit 230 may charge the sixth node QB_B using the high-level second voltage VDD to pull up the sixth node QB_B to a high level.

In some embodiments of the present disclosure, because the first node Q1 and the second node Q2 are simultaneously charged to a high level, the fifth node QB_A and the sixth node QB_B are simultaneously pulled down to a low level; because the first node Q1 and the second node Q2 are simultaneously pulled down to a low level, the fifth node QB_A and the sixth node QB_B are simultaneously pulled up to a high level. That is, the level of the first node Q1 and the level of the second node Q2 "rise and fall simultaneously", and the level of the fifth node QB_A and the level of the sixth node QB_B "rise and fall simultaneously".

The third reset circuit 240 is connected to the second node Q2 and the leakage prevention node OF, and is configured to transmit the level of the leakage prevention node OF to the second node Q2 under the control of the level of the sixth node QB_B. For example, the third reset circuit 240 is connected to the sixth node QB_B, and when the third reset circuit 240 is turned on under the control of the level of the sixth node QB_B, the level of the leakage prevention node OF may be transmitted to the second node Q2.

In the shift register units 10 provided by some embodiments of the present disclosure, the first reset circuit 140 and the third reset circuit 240 are electrically connected through the leakage prevention node OF, so that the first reset circuit 140 is multiplexed. For example, when the sixth node QB_B is at a high level (the fifth node QB_A is also at a high level at this time), the first reset circuit 140 and the third reset circuit 240 are turned on simultaneously, so that the low-level third voltage VGL1 may pull down and reset the second node Q2 through the first reset circuit 140, the leakage prevention node OF, and the third reset circuit 240.

The fourth reset circuit 250 is configured to reset the second output signal terminal OP2 under the control of the level of the sixth node QB_B. For example, the fourth reset circuit 250 is connected to the sixth node QB_B and the second output signal terminal OP2, and is configured to receive a fourth voltage VGL2. For example, when the fourth reset circuit 250 is turned on under the control of the level of the sixth node QB_B, the second output signal terminal OP2 may be pulled down and reset using the low-level fourth voltage VGL2. It should be noted that in some embodiments of the present disclosure, the second output signal terminal OP2 may also be pulled down and reset using the third voltage VGL1, which is not limited in the present disclosure.

It should be noted that in the embodiments of the present disclosure, each node (the first node Q1, the second node Q2, the third node H, the fourth node N, the fifth node QB_A, the sixth node QB_B, etc.) and each output terminal (the shift signal output terminal CRT, the first output signal terminal OP1, the second output signal terminal OP2, etc.) are all provided for a better description of the circuit structure, and do not indicate actual components. A node represents a meeting point of related circuit connections in a circuit structure, that is, the related circuits connected to the same node are electrically connected to each other. For example, as illustrated in FIG. 8, the first control circuit 130 and the first reset circuit 140 are both connected to the fifth node QB_A, which means that these circuits are electrically connected to each other.

Figure 9:
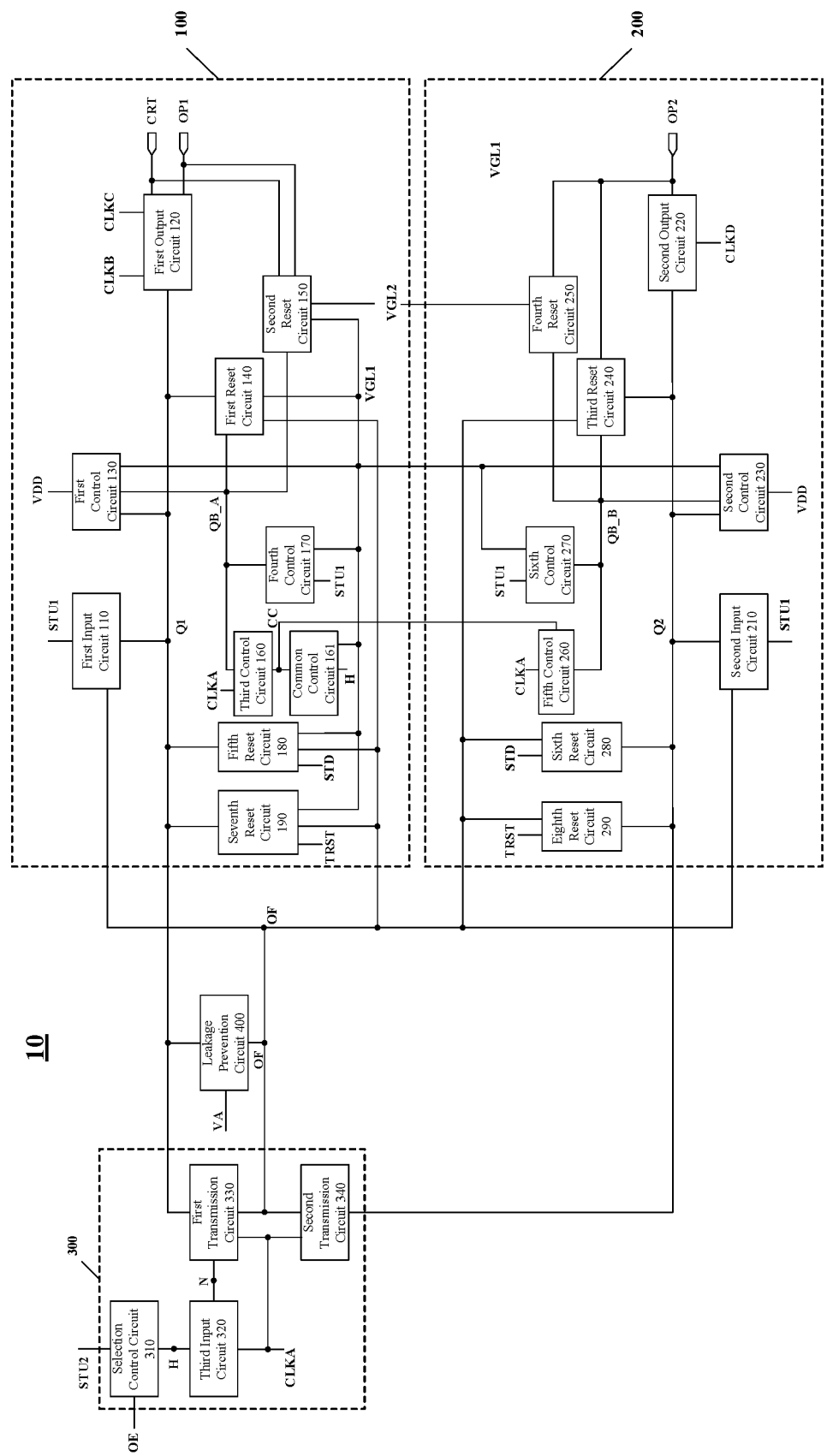
FIG. 9 is a schematic diagram of still another shift register unit provided by some embodiments of the present disclosure.

As illustrated in FIG. 9, in the shift register units 10 provided by some embodiments of the present disclosure, the first sub-circuit 100 further includes a third control circuit 160, a fourth control circuit 170, and a common control circuit 161; the second sub-circuit 200 further includes a fifth control circuit 260 and a sixth control circuit 270.

The third control circuit 160 is connected to the fifth node QB_A and a common control node CC, and is configured to, in response to the first clock signal CLKA, enable the fifth node QB_A to be electrically connected to the common control node CC.

The common control circuit 161 is electrically connected to the common control node CC and the third node H, and is configured to control the level of the common control node CC under the control of the level of the third node H. For example, the common control circuit 161 may be configured to receive the low-level third voltage VGL1, and when the common control circuit 161 is turned on under the control of the level of the third node H, the level of the common node CC may be pulled down to a low level using the third voltage VGL1.

The fifth control circuit 260 is connected to the sixth node QB_B and the common control node CC, and is configured to, in response to the first clock signal CLKA, enable the sixth node QB_B to be electrically connected to the common control node CC.

For example, in the blanking period of one frame, when the first clock signal CLKA is at a high level and the third node H is at a high level, the third control circuit 160, the common control circuit 161, and the fifth control circuit 260 are all turned on, so that the low-level third voltage VGL1 may pull down the fifth node QB_A through the common control circuit 161 and the third control circuit 160, and the low-level third voltage VGL1 may pull down the sixth node QB_B through the fifth control circuit 260 and the common control 161. That is, the common control circuit 161 is used to control both the level of the fifth node QB_A and the level of the sixth node QB_B. Therefore, the common control circuit 161 is multiplexed, so that the circuit structure may be simplified.

As illustrated in FIG. 9, the fourth control circuit 170 is configured to control the level of the fifth node QB_A in response to the first input signal STU1. For example, the fourth control circuit 170 may be configured to receive the low-level third voltage VGL1. For example, in the display period of one frame, the fourth control circuit 170 is turned on in response to the first input signal STU1, so that the fifth node QB_A may be pulled down using the low-level third voltage VGL1. Pulling down the fifth node QB_A to a low potential can avoid the influence of the fifth node QB_A on the first node Q1, thereby making the first node Q1 more fully charged in the display period.

The sixth control circuit 270 is configured to control the level of the sixth node QB_B in response to the first input signal STU1. For example, the sixth control circuit 270 may be configured to receive the low-level third voltage VGL1. For example, in the display period of one frame, the sixth control circuit 270 is turned on in response to the first input signal STU1, so that the sixth node QB_B may be pulled down using the low-level third voltage VGL1. Pulling down the sixth node QB_B to a low potential can avoid the influence of the sixth node QB_B on the second node Q2, thereby making the second node Q2 more fully charged in the display period.

As illustrated in FIG. 9, the first sub-circuit 100 further includes a fifth reset circuit 180 and a seventh reset circuit 190, and the second sub-circuit 200 further includes a sixth reset circuit 280 and an eighth reset circuit 290.

The fifth reset circuit 180 is connected to the first node Q1 and the leakage prevention node OF, and is configured to reset the first node Q1 and the leakage prevention node OF in response to the display reset signal STD.

The sixth reset circuit 280 is connected to the second node Q2 and the leakage prevention node OF, and is configured to transmit the level of the leakage prevention node OF to the second node Q2 in response to the display reset signal STD.

For example, the fifth reset circuit 180 may be configured to receive the low-level third voltage VGL1. For example, in the display period of one frame, both the fifth reset circuit 180 and the sixth reset circuit 280 are turned on in response to the display reset signal STD, so that the low-level third voltage VGL1 may pull down and reset the first node Q1 and the leakage prevention node OF through the fifth reset circuit 180. At the same time, the low-level third voltage VGL1 may pull down and reset the second node Q2 through the sixth reset circuit 280 and the fifth reset circuit 180. For example, in the case where a plurality of shift register units 10 are cascaded to form a gate driving circuit, the shift register unit 10 of a certain stage may receive the shift signal CR output by the shift register unit 10 of other stage as the display reset signal STD.

As described above, in the shift register units 10 provided by some embodiments of the present disclosure, the fifth reset circuit 180 and the sixth reset circuit 280 are both connected to the leakage prevention node OF, so the leakage of the first node Q1 through the fifth reset circuit 180 can be avoided, and the leakage of the second node Q2 through the sixth reset circuit 280 can be avoided.

In addition, on the basis of preventing leakage, the fifth reset circuit 180 and the sixth reset circuit 280 are electrically connected through the leakage prevention node OF, so that the fifth reset circuit 180 may be multiplexed, and the circuit structure may be simplified.

The seventh reset circuit 190 is connected to the first node Q1 and the leakage prevention node OF, and is configured to reset the first node Q1 and the leakage prevention node OF in response to the total reset signal TRST.

The eighth reset circuit 290 is connected to the second node Q2 and the leakage prevention node OF, and is configured to transmit the level of the leakage prevention node OF to the second node Q2 in response to the total reset signal TRST.

For example, the seventh reset circuit 190 may be configured to receive the low-level third voltage VGL1. For example, in the case where a plurality of shift register units 10 are cascaded to form a gate drive circuit, before the display period of one frame, the seventh reset circuit 190 and the eighth reset circuit 290 in each stage of the shift register unit 10 are both turned on in respond to the total reset signal TRST, so that the low-level third voltage VGL1 may pull down and reset the first node Q1 and the leakage prevention node OF through the seventh reset circuit 190. At the same time, the low-level third voltage VGL1 may pull down and reset the second node Q2 through the eighth reset circuit 290 and the seventh reset circuit 190.

As described above, in the shift register units 10 provided by some embodiments of the present disclosure, the seventh reset circuit 190 and the eighth reset circuit 290 are both connected to the leakage prevention node OF, so the leakage of the first node Q1 through the seventh reset circuit 190 can be avoided, and the leakage of the second node Q2 through the eighth reset circuit 290 can be avoided.

In addition, on the basis of preventing leakage, the seventh reset circuit 190 and the eighth reset circuit 290 are electrically connected through the leakage prevention node OF, so that the seventh reset circuit 190 may be multiplexed, and the circuit structure may be simplified.

It should be understood by those skilled in the art that although a plurality of control circuits and a plurality of reset circuits are illustrated in FIG. 7, the above examples do not limit the protection scope of the present disclosure. In a practical application, those skilled in the art can select one or more of the above circuits according to a situation, and various combinations based on the above various circuits are not deviated from the principle of the present disclosure. Details are not described herein again.

Figure 10:
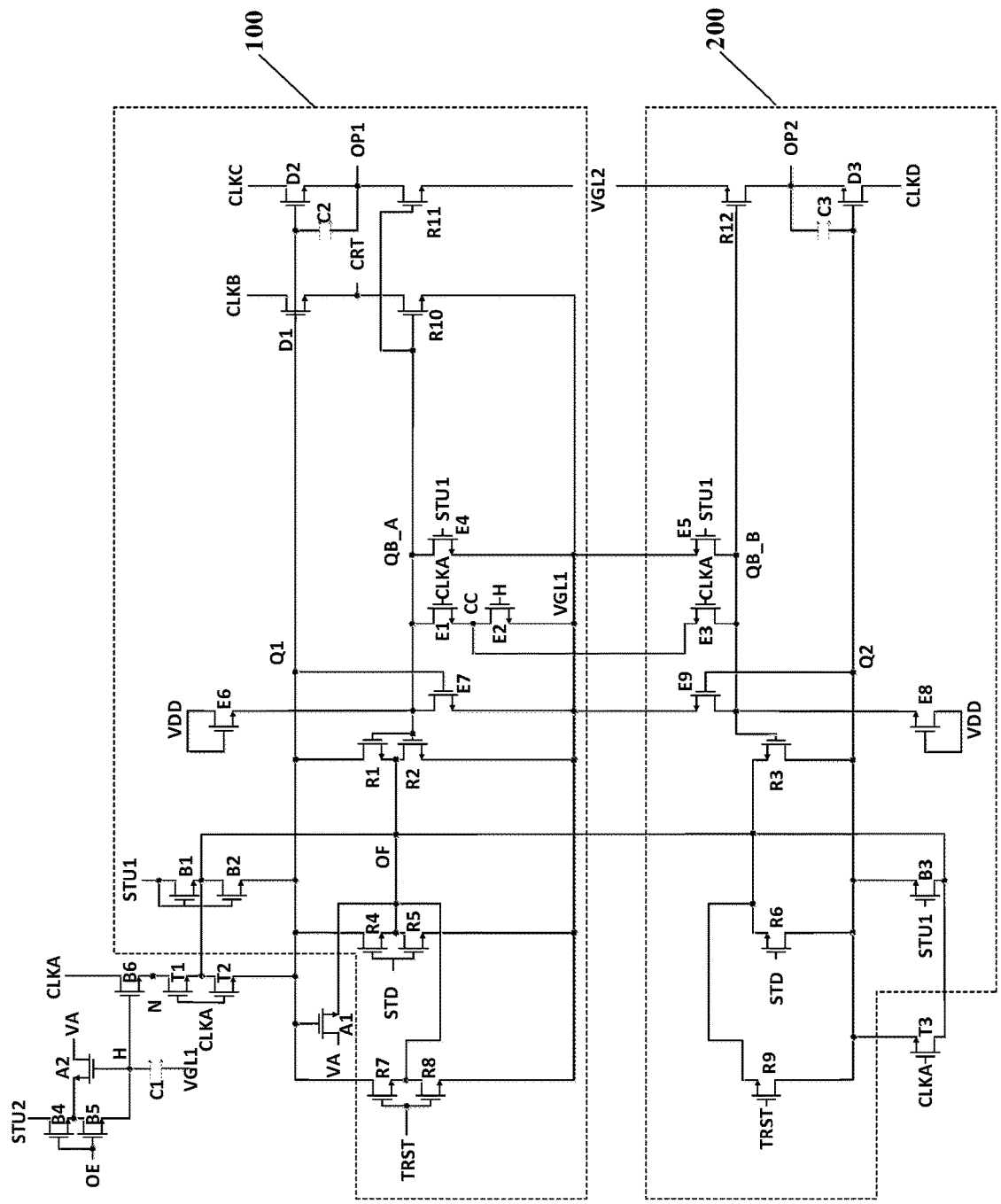
FIG. 10 is a circuit diagram of a shift register unit provided by some embodiments of the present disclosure.

In some embodiments of the present disclosure, the shift register unit 10 may be implemented as the circuit structure illustrated in FIG. 10. As illustrated in FIG. 10, the shift register unit 10 includes a first sub-circuit 100, a second sub-circuit 200, a blanking input sub-circuit 300 and a leakage prevention circuit 400.

The first sub-circuit 100 includes a first input circuit 110, a first output circuit 120, a first control circuit 130, a first reset circuit 140, a second reset circuit 150, a third control circuit 160, a common control circuit 161, a fourth control Circuit 170, a fifth reset circuit 180, and a seventh reset circuit 190.

The second sub-circuit 200 includes a second input circuit 210, a second output circuit 220, a second control circuit 230, a third reset circuit 240, a fourth reset circuit 250, a fifth control circuit 260, a sixth control circuit 270, a sixth reset circuit 280, and an eighth reset circuit 290.

It should be noted that examples of the transistors of the blanking input sub-circuit 300, the leakage prevention circuit 400, the first input circuit 110, and the second input circuit 210 have been described above, and will not be repeated here.

As illustrated in FIG. 10, the first output circuit 120 may include a first output transistor D1, a second output transistor D2, and a second capacitor C2. The gate electrode of the first output transistor D1 is connected to the first node Q1, the first electrode of the first output transistor D1 is configured to receive the second clock signal CLKB as the shift signal CR, and the second electrode of the first output transistor D1 is connected to the shift signal output terminal CRT, and is configured to output the shift signal CR.

The gate electrode of the second output transistor D2 is connected to the first node Q1, the first electrode of the second output transistor D2 is configured to receive the third clock signal CLKC as the first output signal OUT1, and the second electrode of the second output transistor D2 is connected to the first output signal terminal OP1, and is configured to output the first output signal OUT1. The first electrode of the second capacitor C2 is connected to the first node Q1, and the second electrode of the second capacitor C2 is connected to the second electrode of the second output transistor D2 (that is, the first output signal terminal OP1).

As illustrated in FIG. 10, the first control circuit 130 may be implemented to include a sixth control transistor E6 and a seventh control transistor E7. The gate electrode and the first electrode of the sixth control transistor E6 are configured to receive the second voltage VDD, and the second electrode of the sixth control transistor E6 is connected to the fifth node QB_A. The gate electrode of the seventh control transistor E7 is connected to the first node Q1, the first electrode of the seventh control transistor E7 is connected to the fifth node QB_A, and the second electrode of the seventh control transistor E7 is configured to receive the low-level third voltage VGL1.

As illustrated in FIG. 10, the second control circuit 230 may be implemented to include an eighth control transistor E8 and a ninth control transistor E9. The gate electrode and the first electrode of the eighth control transistor E8 are configured to receive the second voltage VDD, and the second electrode of the eighth control transistor E8 is connected to the sixth node QB_B. The gate electrode of the ninth control transistor E9 is connected to the second node Q2, the first electrode of the ninth control transistor E9 is connected to the sixth node QB_B, and the second electrode of the ninth control transistor E9 is configured to receive the low-level third voltage VGL1.

As illustrated in FIG. 10, the first reset circuit 140 may be implemented to include a first reset transistor R1 and a second reset transistor R2, and the third reset circuit 240 includes a third reset transistor R3.

The gate electrode of the first reset transistor R1 is connected to the fifth node QB_A, the first electrode of the first reset transistor R1 is connected to the first node Q1, and the second electrode of the first reset transistor R1 is connected to the leakage prevention node OF. The gate electrode of the second reset transistor R2 is connected to the fifth node QB_A, the first electrode of the second reset transistor R2 is connected to the leakage prevention node OF, and the second electrode of the second reset transistor R2 is configured to receive the low-level third voltage VGL1.

The gate electrode of the third reset transistor R3 is connected to the sixth node QB_B, the first electrode of the third reset transistor R3 is connected to the second node Q2, and the second electrode of the third reset transistor R3 is connected to the leakage prevention node OF.

In the shift register units 10 provided by some embodiments of the present disclosure, connecting the first reset transistor R1 to the leakage prevention node OF may prevent the first node Q1 from leaking through the first reset transistor R1; connecting the third reset transistor R3 to the leakage prevention node OF may prevent the second node Q2 from leaking through the third reset transistor R3. On the basis of preventing leakage, when performing reset operation on the first node Q1 and the second node Q2, the second reset transistor R2 may also be multiplexed, so that the number of transistors is saved, the bezel size of the display device adopting the shift register unit is reduced, and the PPI of the display device is further improved.

As illustrated in FIG. 10, the second reset circuit 150 includes a tenth reset transistor R10 and an eleventh reset transistor R11.

The gate electrode of the tenth reset transistor R10 is connected to the fifth node QB_A, the first electrode of the tenth reset transistor R10 is connected to the shift signal output terminal CRT, and the second electrode of the tenth reset transistor R10 is configured to receive the low-level third voltage VGL1. The gate electrode of the eleventh reset transistor R11 is connected to the fifth node QB_A, the first electrode of the eleventh reset transistor R11 is connected to the first output signal terminal OP1, and the second electrode of the eleventh reset transistor R11 is configured to receive the low-level fourth voltage VGL2.

As illustrated in FIG. 10, the fourth reset circuit 250 includes a twelfth reset transistor R12. The gate electrode of the twelfth reset transistor R12 is connected to the sixth node QB_B, the first electrode of the twelfth reset transistor R12 is connected to the second output signal terminal OP2, and the second electrode of the twelfth reset transistor R12 is configured to receive the low-level fourth voltage VGL2.

As illustrated in FIG. 10, the third control circuit 160 includes a first control transistor E1, the fourth control circuit 170 includes a fourth control transistor E4, and the common control circuit 161 includes a second control transistor E2.

The gate electrode of the first control transistor E1 is configured to receive the first clock signal CLKA, the first electrode of the first control transistor E1 is connected to the fifth node QB_A, and the second electrode of the first control transistor E1 is connected to the common control node CC.

The gate electrode of the second system transistor E2 is connected to the third node H, the first electrode of the second control transistor E2 is connected to the common control node CC, and the second electrode of the second control transistor E2 is configured to receive the low-level third voltage VGL1.

The gate electrode of the fourth control transistor E4 is configured to receive the first input signal STU1, the first electrode of the fourth control transistor E4 is connected to the fifth node QB_A, and the second electrode of the fourth control transistor E4 is configured to receive the low-level third voltage VGL1.

As illustrated in FIG. 10, the fifth control circuit 260 includes a third control transistor E3, and the sixth control circuit 270 includes a fifth control transistor E5.

The gate electrode of the third control transistor E3 is configured to receive the first clock signal CLKA, the first electrode of the third control transistor E3 is connected to the sixth node QB_B, and the second electrode of the third control transistor E3 is connected to the common control node CC.

The gate electrode of the fifth control transistor E5 is configured to receive the first input signal STU1, the first electrode of the fifth control transistor E5 is connected to the sixth node QB_B, and the second electrode of the fifth control transistor E5 is configured to receive the low-level third voltage VGL1.

In the shift register units 10 provided by some embodiments of the present disclosure, the second control transistor E2 may be multiplexed by setting the common control node CC, thereby saving the number of transistors, and simplifying the circuit structure.

As illustrated in FIG. 10, the fifth reset circuit 180 includes a fourth reset transistor R4 and a fifth reset transistor R5, the sixth reset circuit 280 includes a sixth reset transistor R6, and the seventh reset circuit 190 includes a seventh reset transistor R7 and an eighth reset transistor R8, and the eighth reset circuit 290 include a ninth reset transistor R9. It should be noted that, the detailed description and technical effects of the fourth reset transistor R4, the fifth reset transistor R5, the sixth reset transistor R6, the seventh reset transistor R7, the eighth reset transistor R8 and the ninth reset transistor R9 may refer to the corresponding description of the embodiment illustrated in FIG. 3, which will not be repeated here.

Figure 11:
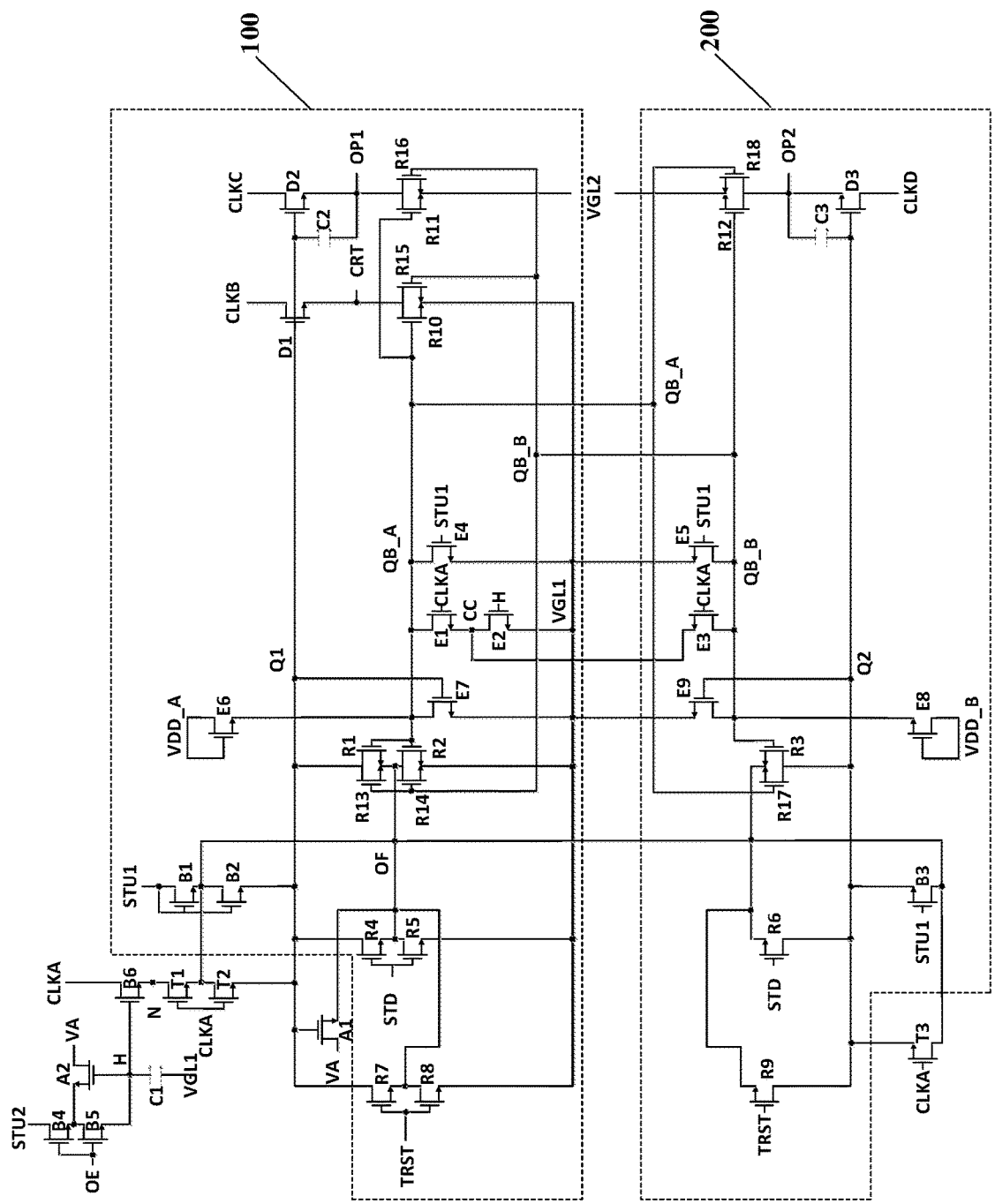
FIG. 11 is a circuit diagram of another shift register unit provided by some embodiments of the present disclosure.

In some embodiments of the present disclosure, the shift register unit 10 may also be implemented as the circuit structure illustrated in FIG. 11. The following describes only the differences between the shift register unit 10 illustrated in FIG. 11 and the shift register unit 10 illustrated in FIG. 10, and the similarities will not be repeated here.

As illustrated in FIG. 11, the shift register unit 10 may further include a thirteenth reset transistor R13, a fourteenth reset transistor R14, a fifteenth reset transistor R15, a sixteenth reset transistor R16, a seventeenth reset transistor R17, and an eighteenth reset transistor R18.

As illustrated in FIG. 11, the gate electrode and the first electrode of the sixth control transistor E6 are configured to receive the fifth voltage VDD_A, and the gate electrode and the first electrode of the eighth control transistor E8 are configured to receive the sixth voltage VDD_B.

It should be noted that, in the embodiments of the present disclosure, for example, the fifth voltage VDD_A and the sixth voltage VDD_B may be configured to be inverted phase signals to each other, that is, when the fifth voltage VDD_A is at a high level, the sixth voltage VDD_B is at a low level, and when the fifth voltage VDD_A is at a low level, the sixth voltage VDD_B is at a high level. In this way, only one of the sixth control transistor E6 and the eighth control transistor E8 is in the working state at the same time, which can avoid the performance drift caused by the transistor working for a long time, thereby improving the stability of the circuit.

Figure 12:
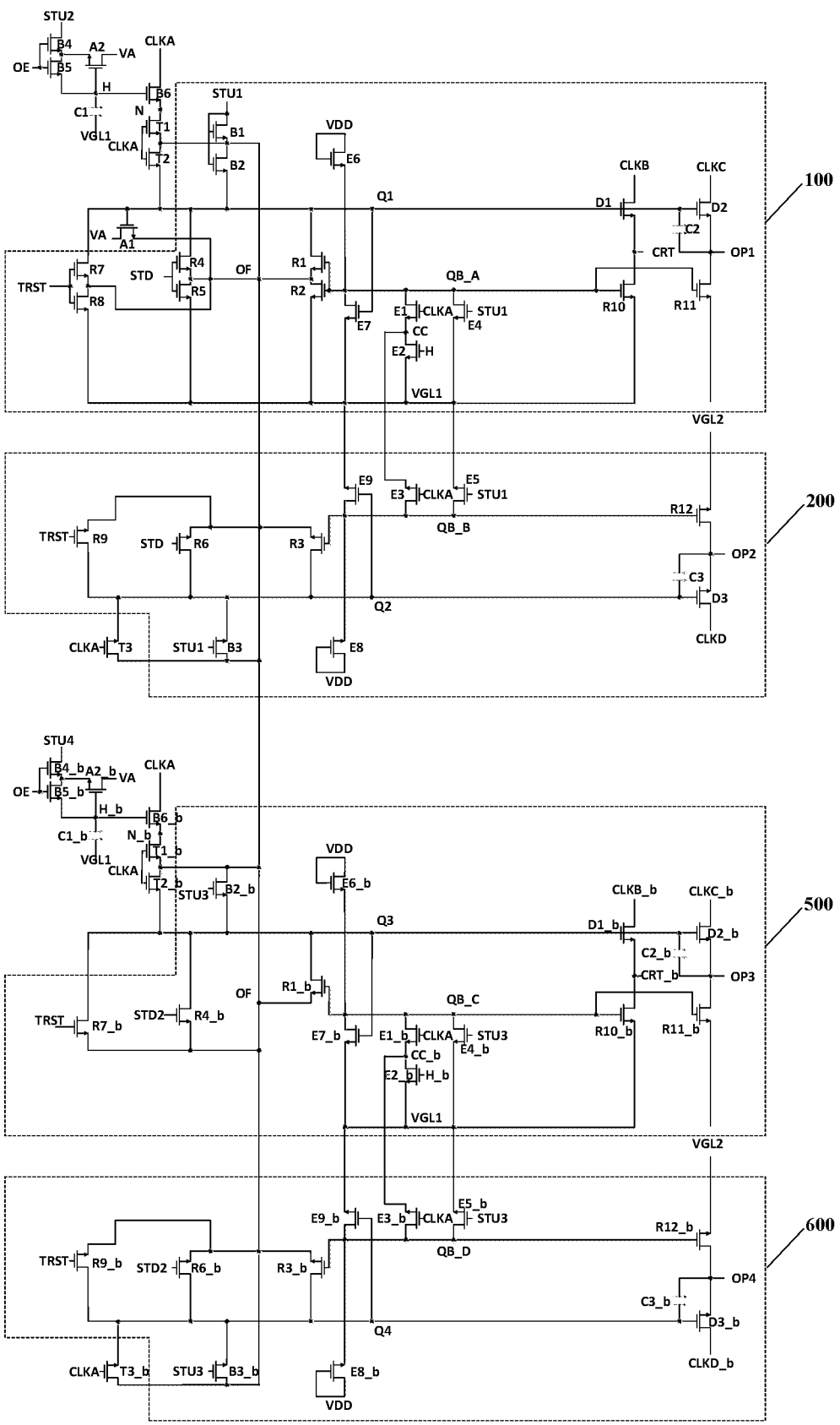
FIG. 12 is a circuit diagram of yet another shift register unit provided by some embodiments of the present disclosure.

As illustrated in FIG. 12, in the shift register unit 10 provided by some embodiments of the present disclosure, the shift register unit 10 includes a first sub-circuit 100, a second sub-circuit 200, a third sub-circuit 500, and a fourth sub circuit 600.

The third sub-circuit 500 and the fourth sub-circuit 600 share the same blanking input sub-circuit, and the third sub-circuit 500, the fourth sub-circuit 600, and the blanking input sub-circuit that is shared include leakage prevention transistor A2_b, input transistors B2_b, B3_b, B4_b, B5_b, B6_b, transmission transistors T1_b, T2_b, T3_b, control transistors E1_b, E2_b, E3_b, E4_b, E5_b, E6_b, E7_b, E8_b, E9_b, reset transistors R1_b, R3_b, R4_b, R6_b, R7_b, R9_b, R10_b, R11_b, R12_b, output transistors D1_b, D2_b, D3_b, capacitors C1_b, C2_b, C3_b. In addition, nodes Q3, Q4, QB_C, QB_D, Hub, N_b, CC_b are provided for the connection between the transistors.

In addition, the third sub-circuit 500 is configured to receive an input signal STU3, a display reset signal STD2, clock signals CLKB_b, CLKC_b, and provide output signals through output terminals CRT_b and OP3. The fourth sub-circuit 600 is configured to receive the input signal STU3, the display reset signal STD2, a clock signal CLKD_b, and provide output signal through an output terminal OP4. The blanking input sub-circuit, which is shared by the third sub-circuit 500 and the fourth sub-circuit 600, is configured to receive an input signal STU4.

As illustrated in FIG. 12, the first sub-circuit 100, the second sub-circuit 200, the third sub-circuit 500, and the fourth sub-circuit 600 are all connected to the leakage prevention node OF, that is, the four sub-circuits share one leakage prevention node OF. In addition, the first sub-circuit 100 and the second sub-circuit 200 share the same blanking input sub-circuit, and the third sub-circuit 500 and the fourth sub-circuit 600 share the same blanking input sub-circuit, so that the number of transistors may be saved, the circuit structure may be simplified, the bezel size of the display device adopting the shift register unit may be reduced, and the PPI of the display device may further be improved.

Figure 13:
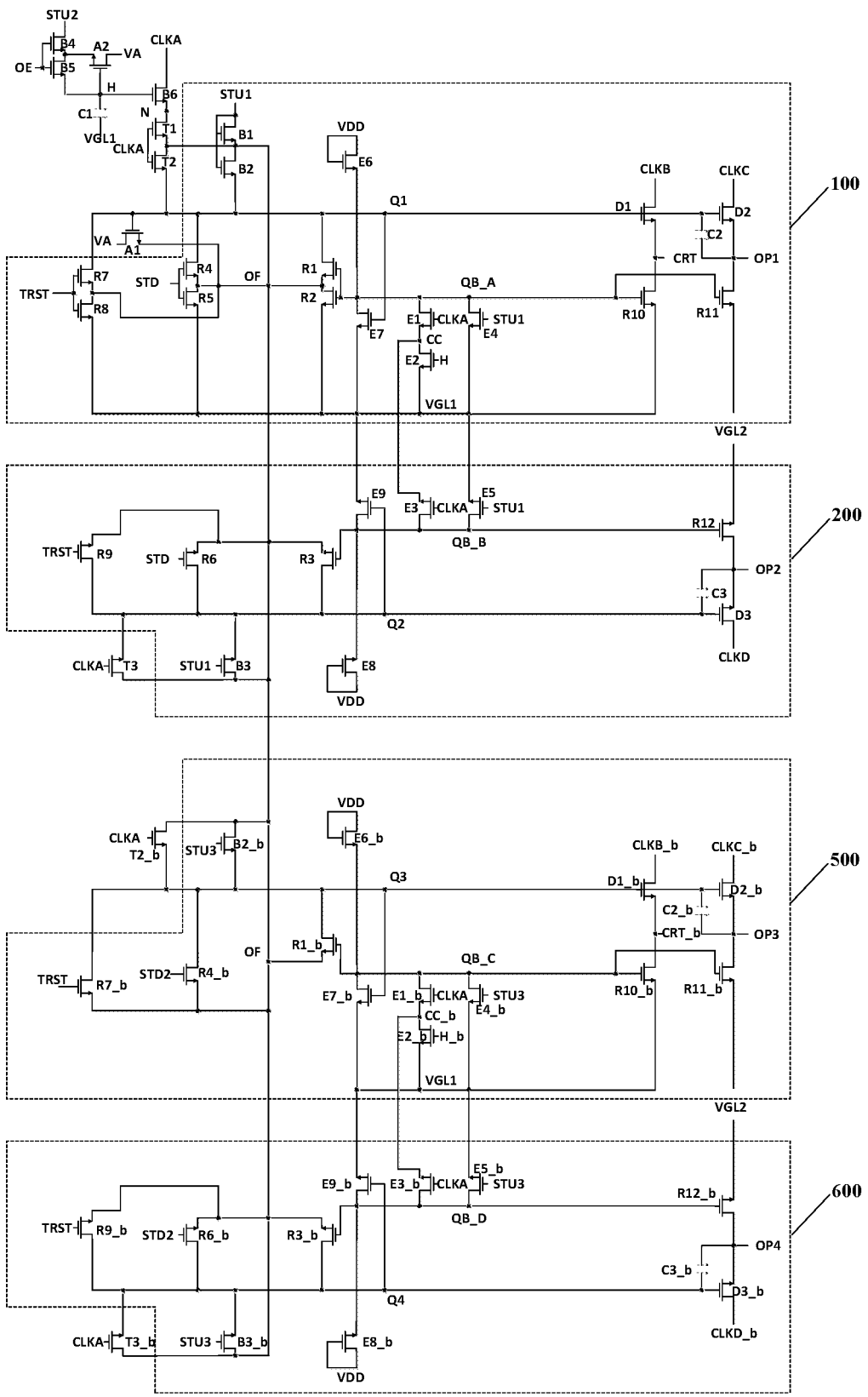
FIG. 13 is a circuit diagram of still another shift register unit provided by some embodiments of the present disclosure.

In some embodiments of the present disclosure, the shift register unit 10 may also be implemented as the circuit structure illustrated in FIG. 13. The following describes only the differences between the shift register unit 10 illustrated in FIG. 13 and the shift register unit 10 illustrated in FIG. 12, and the similarities will not be repeated here.

As illustrated in FIG. 13, the first sub-circuit 100, the second sub-circuit 200, the third sub-circuit 500, and the fourth sub-circuit 600 in the shift register unit 10 are all connected to the leakage prevention node OF, that is, the four sub-circuits are shared a leakage prevention node OF. In addition, the first sub-circuit 100, the second sub-circuit 200, the third sub-circuit 500, and the fourth sub-circuit 600 also share the same blanking input sub-circuit, so that the number of transistors may further be saved, the circuit structure may be simplified, the bezel size of the display device adopting the shift register unit may be reduced, and the PPI of the display device may further be improved.

As described above, in the shift register units 10 provided by the embodiments of the present disclosure, the level of the third node H may be maintained by the first capacitor C1, the level of the first node Q1 may be maintained by the second capacitor C2, and the level of the second node Q2 may be maintained by the third capacitor C3. The first capacitor C1, the second capacitor C2, and the third capacitor C3 may be the capacitor component fabricated by a manufacturing process, for example, by fabricating a dedicated capacitor electrode. Each electrode of the capacitor may be implemented through a metal layer, a semiconductor layer (e.g., doped polysilicon) and the like. And in some examples, by designing circuit wiring parameters enables that the first capacitor C1, the second capacitor C2, and the third capacitor C3 may also be implemented by parasitic capacitance between the various devices. The connection manner of the first capacitor C1, the second capacitor C2, and the third capacitor C3 is not limited to the manner described above, and may be other suitable connection manners as long as the levels provided to the third node H, the first node Q1, and the second node Q2 can be stored.

Figure 14:
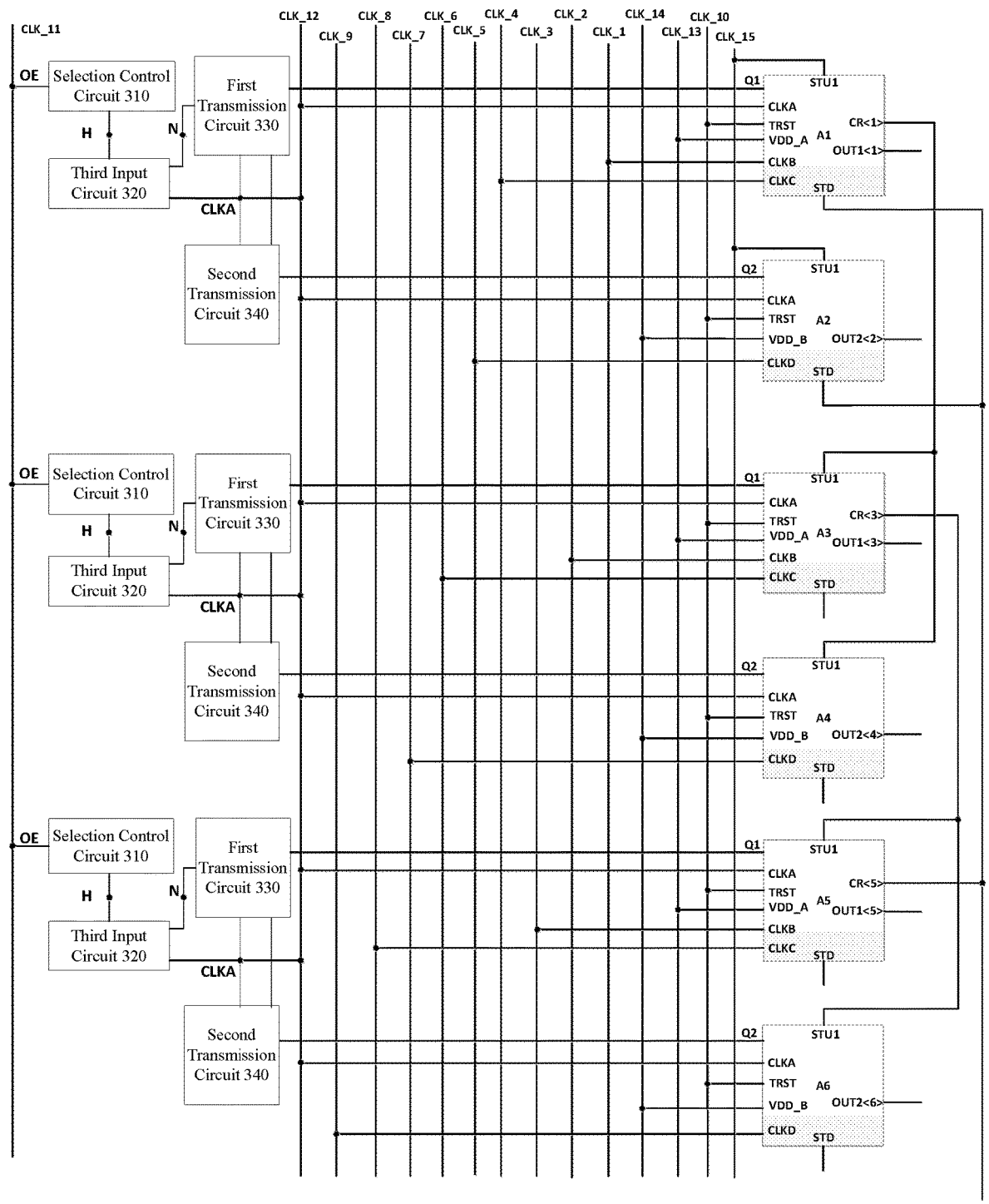
FIG. 14 is a schematic diagram of a gate driving circuit provided by some embodiments of the present disclosure.

An embodiment of the present disclosure further provides a gate driving circuit 20, as illustrated in FIG. 14, the gate driving circuit 20 includes a plurality of cascaded shift register units 10, and any one or more shift register units 10 may adopt the structure or variant of the shift register unit 10 provided by the embodiment of the present disclosure, for example, the shift register unit 10 illustrated in FIG. 11 is adopted. A1, A2, A3, A4, A5, and A6 in FIG. 14 represent sub-circuits in the shift register unit 10, for example, A1, A3, and A5 represent the first sub-circuits in three shift register units 10, respectively, and A2, A4 and A6 represent the second sub-circuits of the three shift register units 10, respectively.

For example, as illustrated in FIG. 14, each shift register unit 10 includes a first sub-circuit and a second sub-circuit to output the first output signal OUT1 and the second output signal OUT2, respectively. In the case where the gate driving circuit 20 is used to drive a display panel, the first output signal OUT1 and the second output signal OUT2 may respectively drive a row of sub-pixel units in the display panel. For example, A1, A2, A3, A4, A5, and A6 may respectively drive the first row, the second row, the third row, the fourth row, the fifth row, and the sixth row of sub-pixel units in the display panel.

The gate driving circuit 20 provided by the embodiment of the present disclosure may share the blanking input sub-circuit, so that the bezel size of the display device adopting the gate driving circuit may be reduced, and the PPI of the display device may be improved. In addition, the random compensation may also be implemented, thereby avoiding the problems of poor display such as the scanning lines and the uneven display brightness due to the progressive sequence compensation.

Next, taking the gate driving circuit 20 illustrated in FIG. 14 as an example, the signal lines in the gate driving circuit 20 are described.

As illustrated in FIG. 14, the gate driving circuit 20 includes a first sub-clock signal line CLK_1, a second sub-clock signal line CLK_2, and a third sub-clock signal line CLK_3. The first sub-circuit in the (3n−2)th-stage shift register unit is connected to the first sub-clock signal line CLK_1 to receive the second clock signal CLKB of the (3n−2)th-stage shift register unit; the first sub-circuit in the (3n−1)th-stage shift register unit is connected to the second sub-clock signal line CLK_2 to receive the second clock signal CLKB of the (3n−1)th-stage shift register unit; the first sub-circuit in the (3n)th-stage shift register unit is connected to the third sub-clock signal line CLK_3 to receive the second clock signal CLKB of the (3n)th-stage shift register unit; and n is an integer greater than zero.

As described above, in the case where the shift register units 10 are cascaded, it is only necessary to sequentially provide the second clock signal CLKB to the first sub-circuit in each stage of the shift register unit 10, and the second clock signal CLKB may be output as the shift signal CR to complete the shift of the scanning.

As illustrated in FIG. 14, the gate driving circuit 20 further includes a fourth sub-clock signal line CLK_4, a fifth sub-clock signal line CLK_5, a sixth sub-clock signal line CLK_6, a seventh sub-clock signal line CLK_7, an eighth sub-clock signal Line CLK_8, and a ninth sub-clock signal line CLK_9.

The first sub-circuit in the (3n−2)th-stage shift register unit is connected to the fourth sub-clock signal line CLK_4 to receive the third clock signal CLKC of the (3n−2)th-stage shift register unit, and the second sub-circuit in the (3n−2)th-stage shift register unit is connected to the fifth sub-clock signal line CLK_5 to receive the fourth clock signal CLKD of the (3n−2)th-stage shift register unit.

The first sub-circuit in the (3n−1)th-stage shift register unit is connected to the sixth sub-clock signal line CLK_6 to receive the third clock signal CLKC of the (3n−1)th-stage shift register unit, and the second sub-circuit in the (3n−1)th-stage shift register unit is connected to the seventh sub-clock signal line CLK_7 to receive the fourth clock signal CLKD of the (3n−1)th-stage shift register unit.

The first sub-circuit in the (3n)th-stage shift register unit is connected to the eighth sub-clock signal line CLK_8 to receive the third clock signal CLKC of the (3n)th-stage shift register unit, and the second sub-circuit in the (3n)th-stage shift register unit is connected to the ninth sub-clock signal line CLK_9 to receive the fourth clock signal CLKD of the (3n)th-stage shift register unit.

As described above, the driving signals that are output row by row are provided to the shift register units 10 of all stages through a total of six clock signal lines including the fourth sub-clock signal line CLK_4, the fifth sub-clock signal line CLK_5, the sixth sub-clock signal line CLK_6, the seventh sub-clock signal line CLK_7, the eighth sub-clock signal line CLK_8, and the ninth sub-clock signal on the line CLK_9. That is, the gate driving circuit 20 provided by the embodiment of the present disclosure may adopt the clock signal of 6CLK, which may cause the waveforms of the driving signals output by the gate driving circuit 20 to overlap, for example, the pre-charge time of each row of sub-pixel units may be increased, so that the gate driving circuit may be suitable for a high-frequency display scanning. The embodiments of the present disclosure do not limit the types of the clock signals adopted, for example, the clock signals such as 8CLK and 10CLK may also be adopted.

As illustrated in FIG. 14, the gate driving circuit 20 further includes a tenth sub-clock signal line CLK_10, an eleventh sub-clock signal line CLK_11, and a twelfth sub-clock signal line CLK_12.

For example, the first sub-circuit and the second sub-circuit in each stage of the shift register unit 10 are both connected to the tenth sub-clock signal line CLK_10 to receive the total reset signal TRST. The selection control circuit 310 in each stage of the shift register unit 10 is connected to the eleventh sub-clock signal line CLK_11 to receive the selection control signal OE. The first sub-circuit, the second sub-circuit, and the third input circuit 320 in each stage of the shift register unit 10 are both connected to the twelfth sub-clock signal line CLK_12 to receive the first clock signal CLKA.

As illustrated in FIG. 14, the gate driving circuit 20 further includes a thirteenth sub-clock signal line CLK_13 and a fourteenth sub-clock signal line CLK_14.

For example, the first sub-circuit in each stage of the shift register unit 10 is connected to the thirteenth sub-clock signal line CLK_13 to receive the third voltage VDD_A; the second sub-circuit in each stage of the shift register unit 10 is connected to the fourteenth sub-clock signal line CLK_14 to receive the fourth voltage VDD_B.

As illustrated in FIG. 14, the gate driving circuit 20 further includes a fifteenth sub-clock signal line CLK_15, and the first sub-circuit and the second sub-circuit in the first-stage shift register unit 10 are connected to the fifteenth sub-clock signal line CLK_15 to receive the first input signal STU1.

As illustrated in FIG. 14, except the first-stage shift register unit 10, the first sub-circuit and the second sub-circuit in the shift register unit 10 of other stage are connected to the first sub-circuit in the shift register unit 10 of a preceding stage, which is before the shift register unit 10 of other stage, to receive the shift signal CR as the first input signal STU1. Except the shift register units 10 of the last two stages, the first sub-circuit and the second sub-circuit in the shift register unit 10 of other stage are connected to the first sub-circuit in the shift register unit 10 of a next second stage, which is after the shift register unit 10 of other stage, to receive the shift signal CR as the display reset signal STD.

It should be noted that the cascaded relationship illustrated in FIG. 14 is only an example, and according to the descriptions of the present disclosure, other cascaded manners may also be adopted according to actual conditions.

Figure 15:
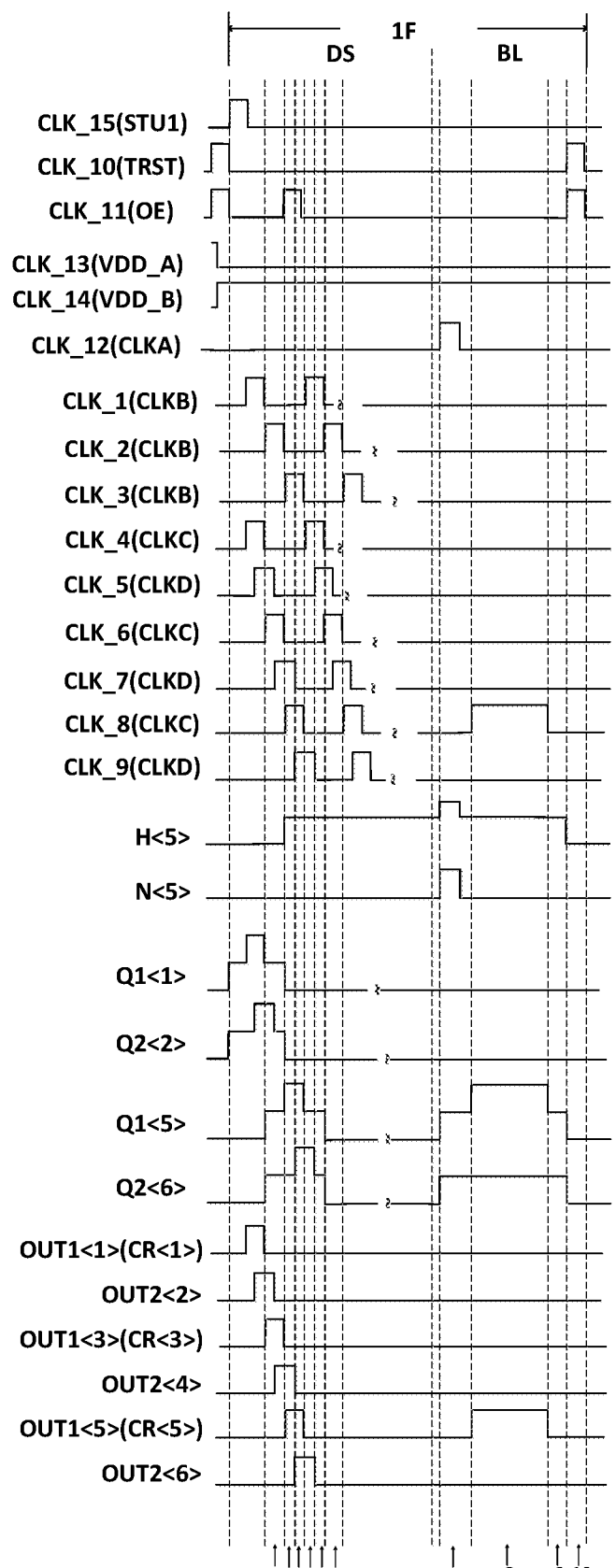
FIG. 15 is a signal timing diagram corresponding to the operation of the gate driving circuit illustrated in FIG. 14 provided by some embodiments of the present disclosure.

For example, in an example, the shift register unit 10 in the gate driving circuit 20 illustrated in FIG. 14 may adopt the circuit structure illustrated in FIG. 11, and FIG. 15 illustrates the signal timing diagram corresponding to the operation of the gate driving circuit illustrated in FIG. 14.

In FIG. 15, H<5> represents the third node H in the third-stage shift register unit 10, and the third-stage shift register unit 10 corresponds to the fifth row and the sixth row of the sub-pixel units in the display panel. N<5> represents the fourth node N in the third-stage shift register unit 10.

Q1<1> and Q2<2> respectively represent the first node Q1 and the second node Q2 in the first-stage shift register unit 10; Q1<5> and Q2<6> respectively represent the first node Q1 and the second node Q2 in the third-stage shift register unit 10. The number in parenthesis indicates the number of the row of the sub-pixel units in the display panel corresponding to the node, and the following embodiments are the same and will not be described in detail.

OUT1<1> and OUT2<2> respectively represent the first output signal OUT1 and the second output signal OUT2 output by the first-stage shift register unit 10. Similarly, OUT1<3> and OUT2<4> respectively represent the first output signal OUT1 and the second output signal OUT2 output by the second-stage shift register unit 10; and OUT1<5> and OUT2<6> respectively represent the first output signal OUT1 and the second output signal OUT2 output by the third-stage shift register unit 10. CR<1>, CR<3>, and CR<5> respectively represent the shift signals CR output by the first-stage shift register unit 10, the second-stage shift register unit 10, and the third-stage shift register unit 10. For example, as illustrated in FIG. 15, in the present embodiment, CR<1> and OUT1<1> are the same, CR<3> and OUT1<3> are the same, and CR<5> and OUT1<5> are the same.

1F represents the first frame, DS represents the display period in the first frame, and BL represents the blanking period in the first frame. In addition, it should be noted that, FIG. 15 is illustrated by taking the fifth voltage VDD_A as a low level and the sixth voltage VDD_B as a high level as an example, but the embodiments of the present disclosure are not limited thereto. The levels of signals in the signal timing diagram illustrated in FIG. 15 is only schematic and do not represent the true level value.

The working principle of the gate driving circuit 20 illustrated in FIG. 14 is described below with reference to the signal timing diagram in FIG. 15 and the shift register unit 10 illustrated in FIG. 11.

Before the start of the first frame 1F, the tenth sub-clock signal line CLK_10 and the eleventh sub-clock signal line CLK_11 provide high levels, the seventh reset transistor R7, the eighth reset transistor R8, and the ninth reset transistor R9 in each stage of the shift register unit 10 are turned on, so that the first node Q1 and the second node Q2 in each stage of the shift register unit 10 may be reset; the fourth input transistor B4 and the fifth input transistor B5 in each stage of the shift register unit 10 are turned on, because the second input signal STU2 received at this time is at a low level, the third node H in each stage of the shift register unit 10 may be reset, so that the total reset may be implemented before the start of the first frame 1F.

In the display period DS of the first frame 1F, the working process for the third-stage shift register unit 10 (that is, corresponding to the fifth and sixth rows of the sub-pixel units in the display panel) is described as follows.

In the first stage 1, the shift signal CR<3> output by the first sub-circuit in the second-stage shift register unit 10 is at a high level, that is, the first input signal STU1 received by the third-stage shift register unit 10 is at a high level, so the first input transistor B1, the second input transistor B2, and the third input transistor B3 are turned on. The high-level first input signal STU1 charges the first node Q1<5> through the first input transistor B1 and the second input transistor B2, thereby pulling up the first node Q1<5> to a high level; the high-level first input signal STU1 may also charge the second node Q2<6> through the first input transistor B1 and the third input transistor B3, thereby pulling up the second node Q2<6> to a high level.

The second output transistor D2 is turned on under the control of the first node Q1<5>, but because the third clock signal CLKC provided by the eighth sub-clock signal line CLK_8 is at a low level at this time, the first output signal OUT1<5> output by the third-stage shift register unit 10 is at a low level; the third output transistor D3 is turned on under the control of the second node Q2<6>, but because the fourth clock signal CLKD provided by the ninth sub-clock signal line CLK_9 is at a low level at this time, so the second output signal OUT2<6> output by the third-stage shift register unit 10 is at a low level; in this stage, the first node and the second node in the third-stage shift register unit 10 are simultaneously pre-charged.

In the second stage 2, the third clock signal CLKC provided by the eighth sub-clock signal line CLK_8 becomes a high level, and the potential of the first node Q1<5> is further pulled up due to the bootstrap effect, so the second output transistor D2 remains turned on, so that the first output signal OUT1<5> output by the third-stage shift register unit 10 becomes a high level. However, because the fourth clock signal CLKD provided by the ninth sub-clock signal line CLK_9 is still at a low level at this time, the second output signal OUT2<6> output by the third-stage shift register unit 10 continues to remain at a low level.

In the third stage 3, the fourth clock signal CLKD provided by the ninth sub-clock signal line CLK_9 becomes a high level, the potential of the second node Q2<6> is further pulled up due to the bootstrap effect, and the third output transistor D3 remains turned on, so that the second output signal OUT2<6> output by the third-stage shift register unit 10 becomes a high level.

In the fourth stage 4, due to the holding effect of the second capacitor C2, the first node Q1<5> still maintains a high level, so the second output transistor D2 is turned on. However, because the third clock signal CLKC provided by the eighth sub-clock signal line CLK_8 becomes a low level, the first output signal OUT1<5> output by the third-stage shift register unit 10 becomes a low level. In addition, due to the bootstrap effect of the second capacitor C2, the potential of the first node Q1<5> also drops.

In the fifth stage 5, due to the holding effect of the third capacitor C3, the second node Q2<6> still maintains a high level, so the third output transistor D3 is turned on. However, because the fourth clock signal CLKD provided by the ninth sub-clock signal line CLK_9 becomes a high level, the second output signal OUT2<6> output by the third-stage shift register unit 10 becomes a low level. In addition, due to the bootstrap effect of the third capacitor C3, the potential of the second node Q2<6> also drops.

In the sixth stage 6, because the clock signal of 6CLK is adopted, the signals output by each three stages of the shift register units 10 (each stage sequentially outputs the first output signal OUT1 and the second output signal OUT2) are a cycle, and because the third-stage shift register unit 10 receives the shift signal CR output by the fifth-stage shift register unit 10 as the display reset signal STD, so in this stage when the third clock signal CLKC provided by the sixth sub-clock signal line CLK_6 becomes a high level, the display reset signal STD received by the third-stage shift register unit 10 is also at a high level, so that the fourth reset transistor R4, the fifth reset transistor R5, and the sixth reset transistor R6 are turned on, and the first node Q1<5> and the second node Q2<6> are pulled down and reset using the low-level third voltage VGL1.

The third-stage shift register unit 10 drives the fifth and sixth rows of the sub-pixels in the display panel to complete the display, accordingly, the fourth-stage shift register unit 10, the fifth-stage shift register units and the like progressively drive the sub-pixel units in the display panel to complete the display driving of one frame. Here, the display period of the first frame ends.

Moreover, the third node H is also charged in the display period DS of the first frame 1F. For example, in the case where the fifth row of sub-pixel units needs to be compensated in the first frame 1F, then the following operations are further performed in the display period DS of the first frame 1F.

In the second stage 2 and the third stage 3, the eleventh sub-clock signal line CLK_11 is provided with the same signal as the shift signal CR<5> output from the third-stage shift register unit 10, so the fourth input transistor B4 and the fifth input transistor B5 are turned on. In addition, the second input signal STU2 received by the third-stage shift register unit 10 may be made to be the same as the shift signal CR<5>, so that the high-level second input signal STU2 may charge the third node H<5>, and the third node H<5> is pulled up to a high level.

It should be noted that the above charging process for the third node H<5> is only an example, and the embodiments of the present disclosure include but are not limited to this. For example, the second input signal STU2 received by the third-stage shift register unit 10 may also be the same as the shift signal CR output by the shift register unit 10 of other stage, while making the signal provided to the eleventh sub-clock signal line CLK_11 has the same signal timing as the second input signal STU2.

The high potential of the third node H<5> may be maintained until the blanking period BL of the first frame 1F.

In the case where the fifth row of sub-pixel units needs to be compensated in the first frame 1F, the following operations are performed in the blanking period BL of the first frame 1F.

In the seventh stage 7, the first clock signal CLKA provided by the twelfth sub-clock signal line CLK_12 is at a high level. Because the third node H<5> remains at a high level in this stage, the sixth input transistor B6 is turned on, the high-level first clock signal CLKA is transmitted to the fourth node N<5> through the sixth input transistor B6, so that the fourth node N<5> becomes a high level. The first transmission transistor T1, the second transmission transistor T2, and the third transmission transistor T3 are turned on under the control of the high-level first clock signal CLKA, so the high-level first clock signal CLKA may charge the first node Q1<5> and the second node Q2<6>, respectively, and the levels of the first node Q1<5> and the second node Q2<6> are pulled up.

In addition, in the seventh stage 7, due to the coupling effect of the first capacitor C1, the fourth node N<5> pulls up, by coupling, the third node H<5> when the fourth node N<5> changes from a low level to a high level, so that the third node H<5> may be kept at a higher high potential to ensure that the sixth input transistor B6 is fully turned on.

Then the first clock signal CLKA provided by the twelfth sub-clock signal line CLK_12 changes from a high level to a low level, so that the fourth node N<5> becomes a low level, due to the coupling effect of the first capacitor C1, the potential of the third node H<5> also drops.

In the eighth stage 8, the third clock signal CLKC provided by the eighth sub-clock signal line CLK_8 becomes a high level, the potential of the first node Q1<5> is further pulled up due to the bootstrap effect, so the second output transistor D2 remains turned on, so that the first output signal OUT1<5> output by the third-stage shift register unit 10 becomes a high level. However, because the fourth clock signal CLKD provided by the ninth sub-clock signal line CLK_9 is still at a low level, the second output signal OUT2<6> output by the third-stage shift register unit 10 is at a low level.

For example, the first output signal OUT1<5> output in the eighth stage 8 may be used to drive the sensing transistors in the sub-pixel units in the display panel to implement the external compensation.

In the ninth stage 9, due to the holding effect of the second capacitor C2, the first node Q1<5> still maintains a high level, so the second output transistor D2 is turned on. However, because the third clock signal CLKC provided by the eighth sub-clock signal line CLK_8 becomes a low level, the first output signal OUT1<5> output by the third-stage shift register unit 10 becomes a low level. In addition, due to the bootstrap effect of the second capacitor C2, the potential of the first node Q1<5> also drops.

In the tenth stage 10, the tenth sub-clock signal line CLK_10 and the eleventh sub-clock signal line CLK_11 provide high levels, the seventh reset transistor R7, the eighth reset transistor R8, and the ninth reset transistor R9 in each stage of the shift register unit 10 are turned on, so that the first node Q1 and the second node Q2 in each stage of the shift register unit 10 may be reset; the fourth input transistor B4 and the fifth input transistor B5 in each stage of the shift register unit 10 are turned on, because the second input signal STU2 received at this time is at a low level, the third node H in each stage of the shift register unit 10 may be reset to complete the total reset.

Here, the driving timing of the first frame 1F ends. The driving method of the gate driving circuit in the subsequent stages such as in the second frame, the third frame, and the like may be with reference to the above description, and details are not described herein again.

It should be noted that, the above descriptions of the working principle of the random compensation is described by taking the case where the driving signal corresponding to the fifth row of the sub-pixel units of the display panel is output during the blanking period of the first frame as an example, which is not limited in the present disclosure. For example, in the case where the driving signal corresponding to the (n)th row of the sub-pixel units of the display panel needs to be output during the blanking period of a frame, the corresponding third node H needs to be pulled up to a high level during the display period DS of the frame, in addition, in the blanking period BL of the frame, the high-level first clock signal CLKA is provided to pull up the potential of the first node Q1 or the second node Q2, and then when it is necessary to output a high-level driving signal, the high-level third clock signal CLKC or fourth clock signal CLKD is provided, n is an integer greater than zero.

In addition, in the embodiments of the present disclosure, the same timing of two signals refers to time synchronization at a high level, and does not require that the two signals have the same amplitude.

Figure 16:
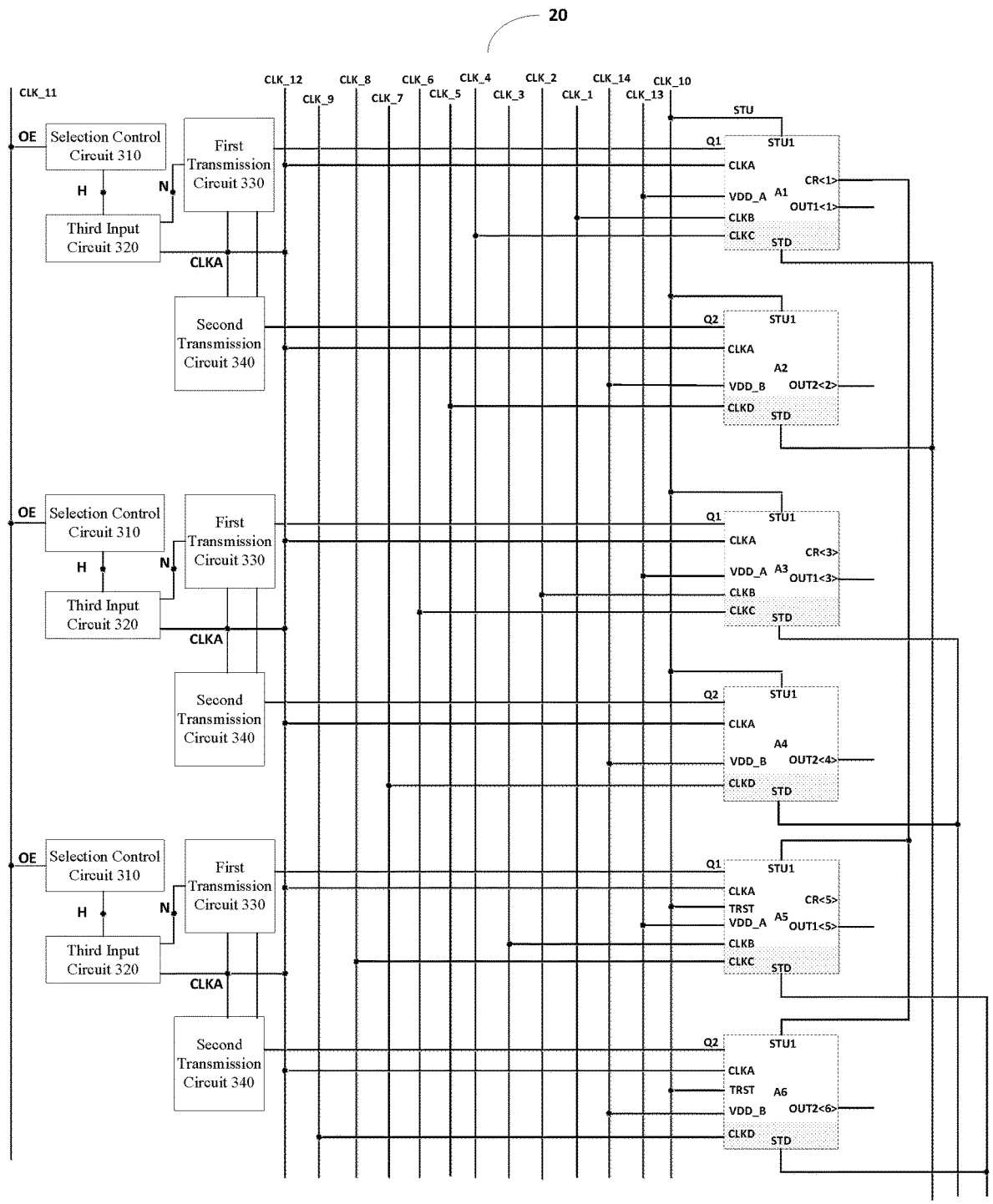
FIG. 16 is a schematic diagram of another gate driving circuit provided by some embodiments of the present disclosure.
Figure 17:
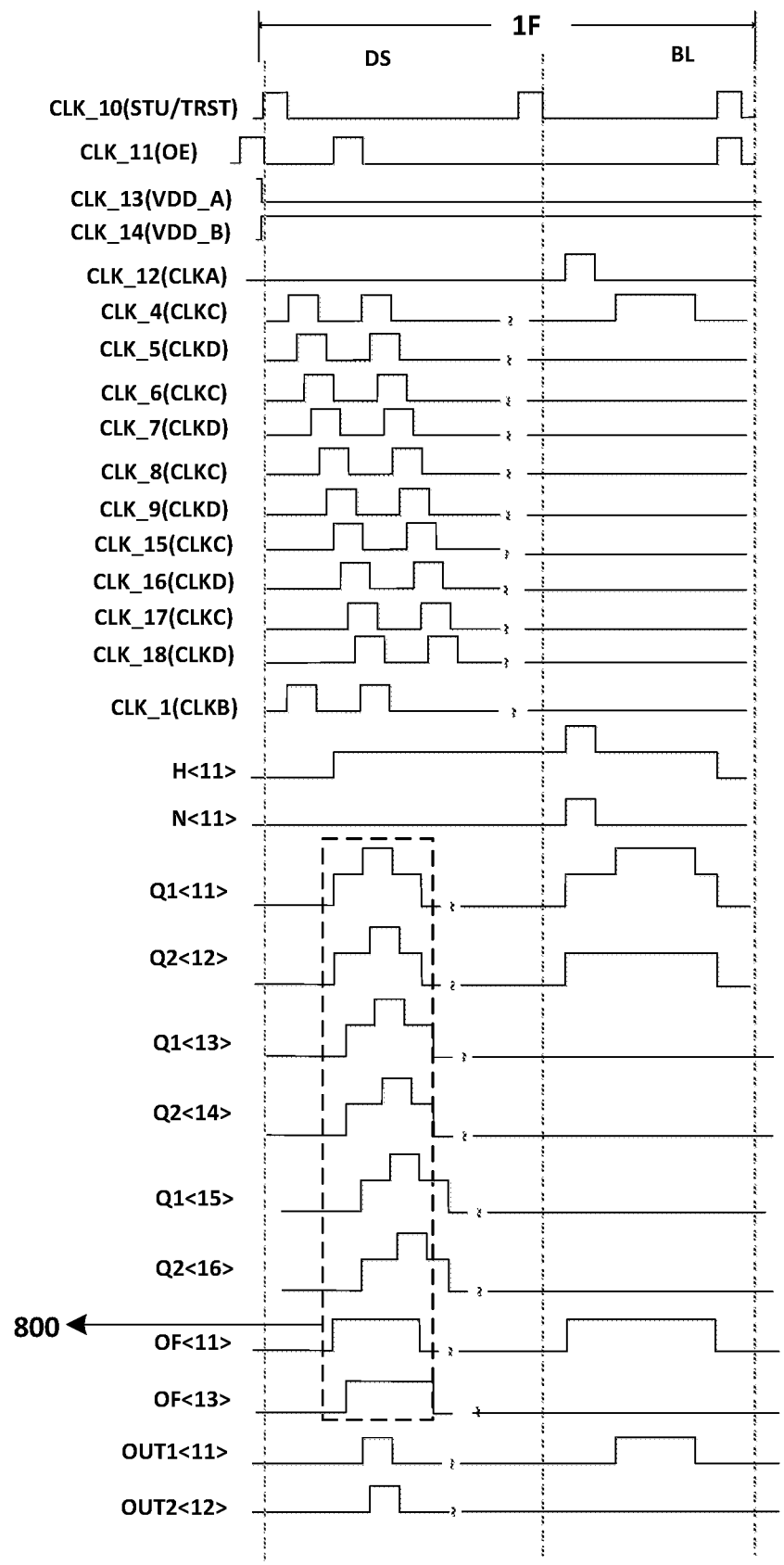
FIG. 17 is a signal timing diagram corresponding to the operation of the gate driving circuit illustrated in FIG. 16 provided by some embodiments of the present disclosure.

Some embodiments of the present disclosure further provide a gate driving circuit 20, as illustrated in FIG. 16, and FIG. 17 is a signal timing diagram corresponding to the operation of the gate driving circuit illustrated in FIG. 16. The differences between the gate driving circuit 20 illustrated in FIG. 16 and the gate driving circuit 20 illustrated in FIG. 14 are described below.

As illustrated in FIG. 16 and FIG. 17, in the present embodiment, the gate driving circuit 20 adopts the clock signal of 10CLK, and the driving signals that are output row by row are provided to the shift register units 10 of all stages through a total of ten clock signal lines including the fourth sub-clock signal line CLK_4, the fifth sub-clock signal line CLK_5, the sixth sub-clock signal line CLK_6, the seventh sub-clock signal line CLK_7, the eighth sub-clock signal line CLK_8, the ninth sub-clock signal line CLK_9, the fifteenth sub-clock signal line CLK_15, the sixteenth sub-clock signal line CLK_16, the seventeenth sub-clock signal line CLK_17, and the eighteenth sub-clock signal line CLK_18. In the embodiment of the present disclosure, the clock signal of 10CLK may be used to further increase the pre-charge time of each row of sub-pixel units, so that the gate driving circuit may be suitable for the display scanning with a higher frequency.

In the embodiments illustrated in FIG. 16 and FIG. 17, except the shift register units 10 of the first two stages, the shift register unit 10 of other stage is connected to the first sub-circuit in the shift register unit 10 of a preceding second stage, which is before the shift register unit 10 of other stage, to receive the shift signal CR as the first input signal STU1. Except the shift register units 10 of the last four stages, the shift register unit 10 of other stage is connected to the first sub-circuit in the shift register unit 10 of a next fourth stage, which is after the shift register unit 10 of other stage, to receive the shift signal CR as the display reset signal STD.

As illustrated in FIG. 16, the tenth sub-clock signal line CLK_10 is connected to the first sub-circuits and the second sub-circuits (that is, A1, A2, A3, and A4) in the shift register units 10 of the first two stages to provide the first input signal STU1, and the tenth sub-clock signal line CLK_10 is further connected to the shift register units 10 of other stages to provide the total reset signal TRST. In this way, the number of the clock signal lines may be saved, so that the bezel size of the display device adopting the gate driving circuit may be reduced, and the PPI of the display device may be improved.

As illustrated in FIG. 17, in the present embodiment, it is selected to compensate the eleventh row of the sub-pixel units (corresponding to the sixth-stage shift register unit 10). In the display period DS of the first frame 1F, the third node H<11> is charged; in the blanking period BL, the high-level first clock signal CLKA is provided to complete the charging of the first node Q1<1> and the second node Q2<12>, and then the fourth sub-clock signal line CLK_4 provides a high-level third clock signal, so that the first output signal OUT1<11> output by the sixth-stage shift register unit 10 is at a high level, and the first output signal OUT1<11> may be used to drive the eleventh row of the sub-pixel units to complete the external compensation.

As illustrated in FIG. 17, OF<11> represents the leakage prevention node OF in the sixth-stage shift register unit 10, and OF<13> represents the leakage prevention node OF in the seventh-stage shift register unit 10. In the embodiment illustrated in FIG. 16 and FIG. 17, the clock signal adopts a clock signal of 10CLK, and 75% of the duration of high levels of adjacent clock signals overlap, so that the first output signal OUT1<11> is valid only during the last 25% of the duration of the high level of the first output signal OUT1<11>, that is, as long as the first node Q1<11> is ensured not to leak during the last 25% of the duration of the high level after the first node Q1<11> is bootstrapped secondly, that is, the level of the leakage prevention node OF is ensured to be a high level during the 25% of the duration.

As illustrated in the dotted box 800 in FIG. 17, the sixth-stage shift register unit, the seventh-stage shift register unit, and the eighth-stage shift register unit may all be connected to the leakage prevention node OF<13> in the seventh-stage shift register unit, during the time that the leakage prevention node OF<13> remains at a high level, Q1<11>, Q2<12>, Q1<13>, Q2<14>, Q1<15>, and Q2<16> may not leak during the 25% of the duration of the high level after Q1<11>, Q2<12>, Q1<13>, Q2<14>, Q1<15>, and Q2<16> are bootstrapped secondly, so that the output abnormalities can be avoided, and poor display of the display panel adopting the gate driving circuit formed by the shift register unit can be avoided. As described above, in the case of adopting the clock signal of 10CLK, at most six sub-circuits in the shift register unit may share one leakage prevention node OF.

Figure 18:
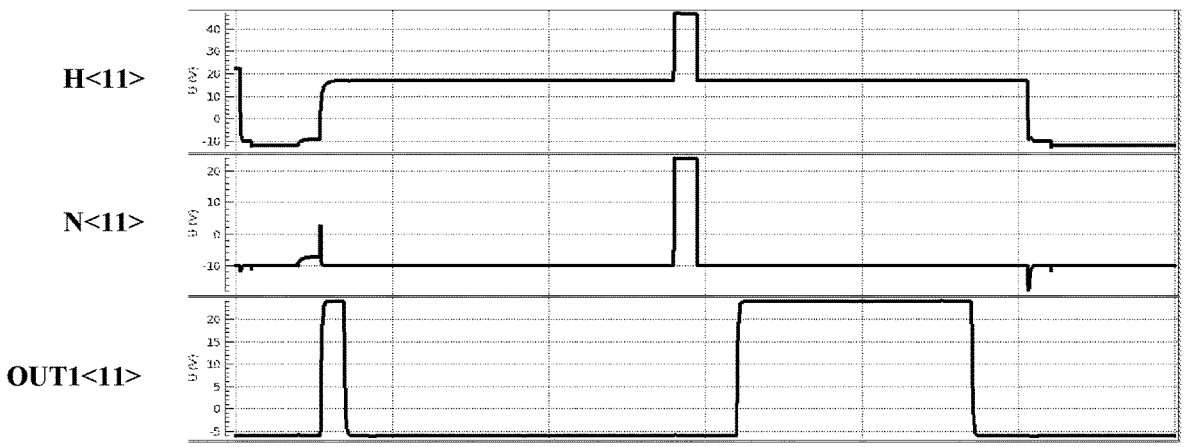
FIG. 18 is a signal simulation diagram of the gate driving circuit illustrated in FIG. 16.

In addition, FIG. 18 illustrates a signal simulation diagram of the third node H<11>, the fourth node N<11>, and the first output signal OUT1<11> illustrated in FIG. 17.

Figure 19:
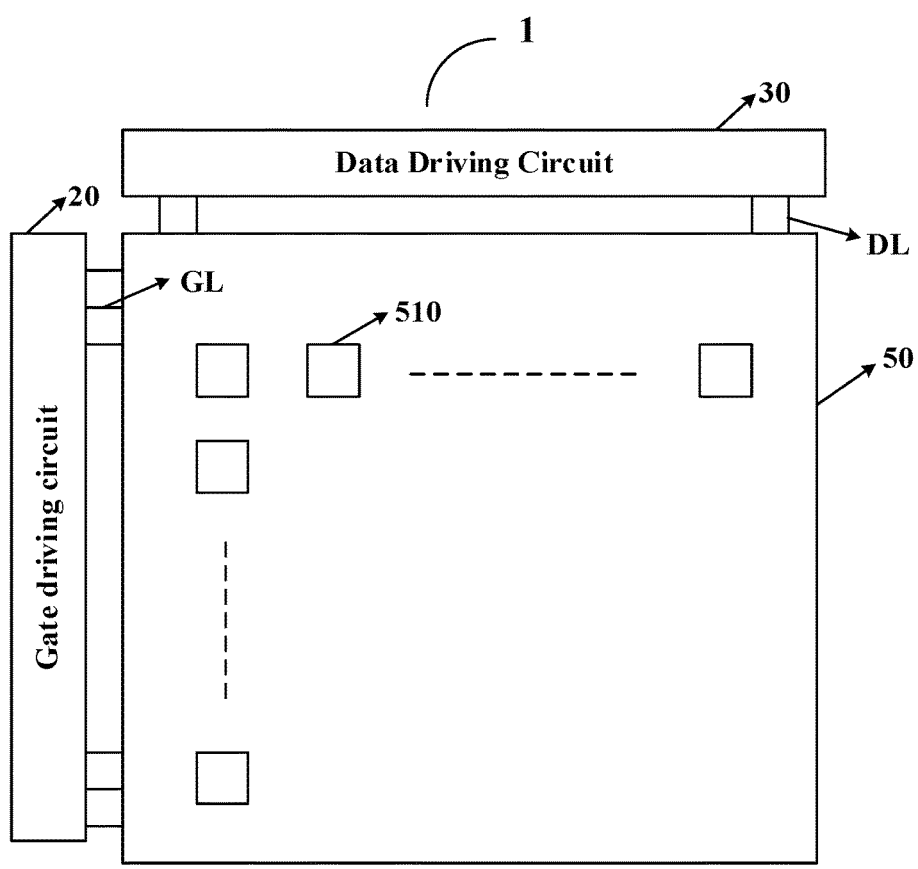
FIG. 19 is a schematic diagram of a display device provided by some embodiments of the present disclosure.

Some embodiments of the present disclosure further provide a display device 1, as illustrated in FIG. 19, the display device 1 includes the gate driving circuit 20 provided by the embodiment of the present disclosure, and a plurality of sub-pixel units 510 arranged in an array. For example, the display device 1 further includes a display panel 50, and the pixel array composed of the plurality of sub-pixel units 510 is disposed in the display panel 50.

The first output signal OUT1 and the second output signal OUT2 output by each shift register unit 10 in the gate driving circuit 20 are respectively provided to the sub-pixel units 510 in different rows, for example, the gate driving circuit 20 is electrically connected to the sub-pixel units 510 through the gate lines GL. The gate driving circuit 20 is used to provide the driving signals to the pixel array, for example, the driving signals may drive the scanning transistors and the sensing transistors in the sub-pixel units 510.

For example, the display device 1 may further include a data driving circuit 30 for providing data signals to the pixel array. For example, the data driving circuit 30 is electrically connected to the sub-pixel units 510 through the data lines DL.

It should be noted that the display device 1 in the present embodiments may be: a liquid crystal panel, a liquid crystal television, a display screen, an OLED panel, an OLED television, an electronic paper display device, a mobile phone, a tablet computer, a notebook computer, a digital photo frame, a navigator, or any product or component with the display function.

The technical effects of the display device 1 provided by the embodiments of the present disclosure can be with reference to the corresponding description of the gate driving circuit 20 in the above embodiments, and details are not described herein again.

Some embodiments of the present disclosure further provide a driving method that may be used to drive the shift register unit 10 provided by the embodiment of the present disclosure, a plurality of the shift register units 10 may be cascaded to form the gate driving circuit provided by an embodiment of the present disclosure, and the gate driving circuit is used to drive the display panel to display at least one frame of pictures.

The driving method includes: causing the leakage prevention circuit 400 to control the level of the leakage prevention node OF under control of the level of the first node Q1, so that the circuit connected between the first node Q1 and the leakage prevention node OF is turned off, and the circuit connected between the second node Q2 and the leakage prevention node OF is turned off.

It should be noted that the detailed description and technical effects of the driving method provided by the embodiments of the present disclosure may be with reference to the description of the working principle of the shift register unit 10 and the gate driving circuit 20 in the embodiments of the present disclosure, and details are not described herein again.

What have been described above are only specific implementations of the present disclosure, the protection scope of the present disclosure is not limited thereto, and the protection scope of the present disclosure should be based on the protection scope of the claims.

What is claimed is:

1. A shift register unit, comprising a first sub-circuit, a leakage prevention circuit and a blanking input sub-circuit, wherein the first sub-circuit comprises a first input circuit and a first output circuit, the first input circuit is configured to control a level of a first node in response to a first input signal, and the first output circuit is configured to output a shift signal and a first output signal under control of the level of the first node;

the blanking input sub-circuit comprises a first transmission circuit, the first transmission circuit comprises a first transmission transistor and a second transmission transistor;

the leakage prevention circuit is connected to the first node, a first voltage and a leakage prevention node;

a gate electrode of the first transmission transistor is configured to receive a first clock signal, a first electrode of the first transmission transistor is connected to a fourth node, and a second electrode of the first transmission transistor is connected to the leakage prevention node; and a gate electrode of the second transmission transistor is configured to receive the first clock signal, a first electrode of the second transmission transistor is connected to the leakage prevention node, and a second electrode of the second transmission transistor is connected to the first node.

2. The shift register unit according to claim 1, wherein the first input circuit is connected to the first node and the leakage prevention node, and is further configured to control the level of the leakage prevention node in response to the first input signal, and wherein the first input circuit comprises a first input transistor, a gate electrode of the first input transistor and a first electrode of the first input transistor are configured to receive the first input signal, and a second electrode of the first input transistor is connected to the leakage prevention node.

3. The shift register unit according to claim 2, wherein the first input circuit further comprises a second input transistor, a gate electrode of the second input transistor is configured to receive the first input signal, a first electrode of the second input transistor is connected to the leakage prevention node, and a second electrode of the second input transistor is connected to the first node.

4. The shift register unit according to claim 1, wherein the first sub-circuit further comprises a third control circuit, and wherein the third control circuit comprises a first control transistor, a gate electrode of the first control transistor is configured to receive the first clock signal, a first electrode of the first control transistor is connected to a fifth node, and a second electrode of the first control transistor is connected to a common control node.

5. The shift register unit according to claim 1, wherein the first sub-circuit further comprises a fourth control circuit, and wherein the fourth control circuit comprises a fourth control transistor, a gate electrode of the fourth control transistor is configured to receive the first input signal, a first electrode of the fourth control transistor is connected to a fifth node, and a second electrode of the fourth control transistor is configured to receive a low-level third voltage.

6. The shift register unit according to claim 1, wherein first sub-circuit further comprises a common control circuit, and wherein the common control circuit comprises a second control transistor, a gate electrode of the second control transistor is connected to a third node, a first electrode of the second control transistor is connected to a common control node, and a second electrode of the second control transistor is configured to receive a low-level third voltage.

7. The shift register unit according to claim 1, wherein the blanking input sub-circuit further comprises a selection control circuit, and wherein the selection control circuit comprises a fourth input transistor and a first capacitor C1, a gate electrode of the fourth input transistor is configured to receive a selection control signal, a first electrode of the fourth input transistor is configured to receive a second input signal, and a second electrode of the fourth input transistor is connected to a third node.

8. The shift register unit according to claim 7, wherein a first electrode of the first capacitor is connected to the third node, a second electrode of the first capacitor is configured to receive a second voltage.

9. The shift register unit according to claim 7, wherein the selection control circuit further comprises a fifth input transistor, and the blanking input sub-circuit further comprises a second leakage prevention transistor, a the first electrode of the second leakage prevention transistor is configured to receive a first voltage, and a second electrode of the second leakage prevention transistor is connected to a first electrode of the fifth input transistor, and a gate electrode of the fifth input transistor is configured to receive a selection control signal, and a second electrode of the fifth input transistor is connected to the third node.

10. The shift register unit according to claim 1, wherein the blanking input sub-circuit further comprises a third input circuit, and wherein the third input circuit comprises a sixth input transistor, a gate electrode of the sixth input transistor is connected to a third node, when the third node is at a high level, the sixth input transistor is turned on, such that a high level is charged to the fourth node.

11. The shift register unit according to claim 1, wherein the first sub-circuit further comprises a first reset circuit, the first reset circuit comprises a first reset transistor and a second reset transistor,
wherein a gate electrode of the first reset transistor is connected to a fifth node, a first electrode of the first reset transistor is connected to the first node, and a second electrode of the first reset transistor is connected to the leakage prevention node; and
wherein a gate electrode of the second reset transistor is connected to the fifth node, a first electrode of the second reset transistor is connected to the leakage prevention node, and a second electrode of the second reset transistor is configured to receive a low-level third voltage.

12. The shift register unit according to claim 1, wherein the first sub-circuit further comprises a fifth reset circuit, and wherein the fifth reset circuit comprises a fourth reset transistor and a fifth reset transistor, wherein a gate electrode of the fourth reset transistor is configured to receive a display reset signal, a first electrode of the fourth reset transistor is connected to the first node, and a second electrode of the fourth reset transistor is connected to the leakage prevention node; and wherein a gate electrode of the fifth reset transistor is configured to receive the display reset signal, a first electrode of the fifth reset transistor is connected to the leakage prevention node, and a second electrode of the fifth reset transistor is configured to receive a low-level third voltage.

13. The shift register unit according to claim 1, wherein the shift register unit further comprises a seventh reset transistor and an eighth reset transistor which are configured to reset the level of the first node, wherein a gate electrode of the seventh reset transistor is configured to receive a total reset signal, a first electrode of the seventh reset transistor is connected to the first node, and a second electrode of the seventh reset transistor is connected to the leakage prevention node; and wherein a gate electrode of the eighth reset transistor is configured to receive the total reset signal, a first electrode of the eighth reset transistor is connected to the leakage prevention node, and a second electrode of the eighth reset transistor is configured to receive a low-level third voltage.

14. The shift register unit according to claim 1, wherein the first sub-circuit further comprises a first control circuit, and wherein the first control circuit comprises a sixth control transistor and a seventh control transistor,
wherein a gate electrode and a first electrode of the sixth control transistor are configured to receive a second voltage, and a second electrode of the sixth control transistor is connected to a fifth node; and
wherein a gate electrode of the seventh control transistor is connected to the first node, a first electrode of the seventh control transistor is connected to the fifth node, and a second electrode of the seventh control transistor is configured to receive a low-level voltage.

15. The shift register unit according to claim 1, wherein the shift register unit further comprises a second sub-circuit, the second sub-circuit comprises a second input circuit and a second output circuit, and
the second input circuit is connected to a second node and the leakage prevention node, and is configured to transmit a level of the leakage prevention node to the second node in response to the first input signal, the second output circuit is configured to output a second output signal under control of the level of the second node.

16. The shift register unit according to claim 15, wherein the second input circuit comprises a third input transistor, and a gate electrode of the third input transistor is configured to receive the first input signal, a first electrode of the third input transistor is connected to the leakage prevention node, and a second electrode of the third input transistor is connected to the second node.

17. The shift register unit according to claim 15, wherein the second sub-circuit further comprises a second control circuit, the second control circuit is connected to the second node and a sixth node, and is configured to receive a second voltage and a low-level third voltage, a
wherein the second control circuit comprises an eighth control transistor and a ninth control transistor, a gate electrode and a first electrode of the eighth control transistor are configured to receive the second voltage, and a second electrode of the eighth control transistor is connected to a sixth node; and
wherein a gate electrode of the ninth control transistor is connected to the second node, a first electrode of the ninth control transistor is connected to the sixth node, and a second electrode of the ninth control transistor is configured to receive a low-level third voltage.

18. The shift register unit according to claim 15, wherein the second sub-circuit further comprises a third reset circuit, a fourth reset circuit and a second output signal terminal,
wherein the third reset circuit is connected to a sixth node, and when the third reset circuit is turned on under the control of the level of the sixth node, the level of the leakage prevention node is transmitted to the second node, wherein the third reset circuit comprises a third reset transistor, a gate electrode of the third reset transistor is connected to the sixth node, a first electrode of the third reset transistor is connected to the second node, and a second electrode of the third reset transistor is connected to the leakage prevention node; and
wherein the fourth reset circuit is connected to the sixth node and the second output signal terminal, and is configured to receive a fourth voltage, wherein the fourth reset circuit comprises a twelfth reset transistor, wherein a gate electrode of the twelfth reset transistor is connected to the sixth node, a first electrode of the twelfth reset transistor is connected to the second output signal terminal, and a second electrode of the twelfth reset transistor is configured to receive a low-level fourth voltage.

19. A gate driving circuit, comprising a plurality of cascaded shift register units, wherein each shift register unit of the plurality of cascaded shift register units comprises a first sub-circuit, a leakage prevention circuit and a blanking input sub-circuit, wherein
the first sub-circuit comprises a first input circuit and a first output circuit, the first input circuit is configured to control a level of a first node in response to a first input signal, and the first output circuit is configured to output a shift signal and a first output signal under control of the level of the first node;

the blanking input sub-circuit comprises a first transmission circuit, the first transmission circuit comprises a first transmission transistor and a second transmission transistor;

the leakage prevention circuit is connected to the first node, a first voltage and a leakage prevention node;

a gate electrode of the first transmission transistor is configured to receive a first clock signal, a first electrode of the first transmission transistor is connected to a fourth node, and a second electrode of the first transmission transistor is connected to the leakage prevention node; and a gate electrode of the second transmission transistor is configured to receive the first clock signal, a first electrode of the second transmission transistor is connected to the leakage prevention node, and a second electrode of the second transmission transistor is connected to the first node.

20. A display device, comprising the gate driving circuit according to claim 19.

* * * * *